US012591343B2

(12) United States Patent
Yoo et al.

(10) Patent No.: US 12,591,343 B2
(45) Date of Patent: Mar. 31, 2026

(54) DISPLAY DEVICE AND ELECTRONIC DEVICE INCLUDING THE SAME

(71) Applicant: SAMSUNG DISPLAY CO., LTD., Yongin-si (KR)

(72) Inventors: Gi Na Yoo, Yongin-si (KR); Hyo Min Kim, Yongin-si (KR); Si Jin Sung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/984,221

(22) Filed: Dec. 17, 2024

(65) Prior Publication Data

US 2025/0383746 A1      Dec. 18, 2025

(30) Foreign Application Priority Data

Jun. 18, 2024    (KR) ........................ 10-2024-0079022
Jul. 9, 2024    (KR) ........................ 10-2024-0090682

(51) Int. Cl.
G06F 3/041      (2006.01)
G06F 3/044      (2006.01)
H01L 27/32      (2006.01)
H10K 59/40      (2023.01)

(52) U.S. Cl.
CPC ........... G06F 3/0446 (2019.05); H10K 59/40 (2023.02); *G06F 2203/04111* (2013.01); *G06F 2203/04112* (2013.01)

(58) Field of Classification Search
CPC ......... G06F 3/0446; G06F 2203/04111; G06F 2203/04112; H10K 59/40
See application file for complete search history.

(56) References Cited

U.S. PATENT DOCUMENTS 10,126,864 B2    11/2018    Jeong et al.
2015/0062457 A1*    3/2015    Kida ...................... G06F 3/0446
349/12
2019/0035860 A1    1/2019    Oh et al.
(Continued)

FOREIGN PATENT DOCUMENTS

EP          3869308 A1      8/2021
KR       10-1929281 B1      3/2019

*Primary Examiner* — Deeprose Subedi

(74) *Attorney, Agent, or Firm* — F. CHAU & ASSOCIATES, LLC

(57)          ABSTRACT

A display device includes a display layer including pixels. An input sensing layer is on the display layer, and includes a first conductive pattern layer, a second conductive pattern layer and a sensing insulating layer. The second conductive pattern layer includes a first sensing electrode array extending in a first direction, and second-first and second-second sensing electrodes that are separated in a second direction with the first sensing electrode array interposed therebetween. The first conductive pattern layer includes a bridge wiring connected to the second-first and second-second sensing electrodes through bridge contact holes defined in the sensing insulating layer and is electrically insulated from and intersects the first sensing electrode array. The bridge wiring includes a bridge opening exposing an insulating layer disposed under the bridge wiring. The first sensing electrode array directly contacts the insulating layer exposed by the bridge opening, through a dummy contact hole.

20 Claims, 25 Drawing Sheets

(56)     References Cited

U.S. PATENT DOCUMENTS

| 2020/0278571 A1 | 9/2020 | Kajita |
| 2022/0269370 A1* | 8/2022 | Baek ..................... G06F 3/0446 |
| 2023/0297199 A1 | 9/2023 | Blondin et al. |

* cited by examiner

FIG. 8

DBR: DBR_SP1, DBR_SP2E1, DBR_SP2E2

ADBR: ADBR_SP1, ADBR_SP2E1, ADBR_SP2E2

DISPLAY DEVICE AND ELECTRONIC DEVICE INCLUDING THE SAME

CROSS-REFERENCE TO RELATED APPLICATION

This application claims priority under 35 U.S.C. § 119 to Korean Patent Application No. 10-2024-0079022, filed on Jun. 18, 2024 in the Korean Intellectual Property Office (KIPO), and Korean Patent Application No. 10-2024-0090682 filed on Jul. 9, 2024 in KIPO, the disclosures of which are incorporated by reference in their entireties herein.

1. TECHNICAL FIELD

The present disclosure relates to a display device and an electronic device including the same.

2. DISCUSSION OF RELATED ART

A display device generates images on a display screen to provide visual information to users. The display device (or, an electronic device including the display device) may include a display area in which an image is displayed, and a sensing area capable of sensing a user's touch input. The display area and the sensing area may overlap each other when viewed in a plan view. Thus, it is possible to sense a touch input from a user of the display device in the display area where an image is displayed.

A sensing electrode array including sensing electrodes may be disposed in the sensing area to sense a user's touch input. However, light reflected by a conductive material constituting the sensing electrode array may be visible to the user. Therefore, a problem may arise in that the visibility of the display device deteriorates.

SUMMARY

To solve the above-mentioned problem, embodiments of the present disclosure are directed to providing a display device with increased visibility and an electronic device including the display device.

According to an embodiment of the present disclosure, a display device includes a display layer including pixels. An input sensing layer is disposed on the display layer. The input sensing layer includes a first conductive pattern layer, a second conductive pattern layer and a sensing insulating layer interposed between the first conductive pattern layer and the second conductive pattern layer. The second conductive pattern layer includes a first sensing electrode array extending in a first direction, and second-first and second-second sensing electrodes that are separated from each other in a second direction intersecting the first direction with the first sensing electrode array interposed therebetween. The first conductive pattern layer includes a bridge wiring connected to the second-first and second-second sensing electrodes through bridge contact holes defined in the sensing insulating layer. The bridge wiring is electrically insulated from and intersects the first sensing electrode array. The bridge wiring includes a bridge opening exposing an insulating layer disposed under the bridge wiring. The first sensing electrode array directly contacts the insulating layer exposed by the bridge opening through a dummy contact hole defined in the sensing insulating layer.

In an embodiment, the bridge opening may surround the dummy contact hole when viewed in a plan view.

In an embodiment, the bridge opening includes a plurality of bridge openings and the dummy contact hole includes a plurality of dummy contact holes. One bridge opening may surround two dummy contact holes when viewed in a plan view.

In an embodiment, the first conductive pattern layer may further include a compensation bridge wiring separated from the bridge wiring.

In an embodiment, the compensation bridge wiring may include: a first compensation bridge wiring connected to the first sensing electrode array through a first compensation contact hole defined in the sensing insulating layer; a second-first compensation bridge wiring connected to the second-first sensing electrode through a second-first compensation contact hole defined in the sensing insulating layer; and a second-second compensation bridge wiring connected to the second-second sensing electrode through a second-second compensation contact hole defined in the sensing insulating layer.

In an embodiment, the first compensation bridge wiring, the second-first compensation bridge wiring and the second-second compensation bridge wiring may be separated from each other.

In an embodiment, each of the bridge wiring, the first compensation bridge wiring, the second-first compensation bridge wiring and the second-second compensation bridge wiring may extend in the second direction.

In an embodiment, a length of the bridge wiring in the second direction may be greater than each of a length of the first compensation bridge wiring in the second direction, a length of the second-first compensation bridge wiring in the second direction and a length of the second-second compensation bridge wiring in the second direction.

In an embodiment, the length of the first compensation bridge wiring in the second direction, the length of the second-first compensation bridge wiring in the second direction and the length of the second-second compensation bridge wiring in the second direction are equal to each other.

In an embodiment, contact holes may be defined in the sensing insulating layer. The bridge contact hole includes a plurality of bridge contact holes, the dummy contact hole includes a plurality of dummy contact holes, the first compensation contact hole includes a plurality of first compensation contact holes, the second-first compensation contact hole includes a plurality of second-first compensation contact holes and the second-second compensation contact hole includes a plurality of second-second compensation contact holes. Each of the contact holes is any one of the plurality of bridge contact holes, the plurality of dummy contact holes, the plurality of first compensation contact holes, the plurality of second-first compensation contact holes and the plurality of second-second compensation contact holes.

In an embodiment, the display device includes unit areas. Each of the unit areas have a same area and a same shape as each other when viewed in a plan view. Each of the unit areas has a same number of contact holes.

In an embodiment, the contact holes are arranged so that a separation distance in the second direction between two contact holes adjacent in the second direction may be constant.

In an embodiment, the contact holes are arranged so that a separation distance in the first direction between two contact holes adjacent in the first direction may be constant.

In an embodiment, each of the pixels may include a first sub-pixel that emits light of a first color, a second sub-pixel that emits light of a second color and a third sub-pixel that emits light of a third color.

In an embodiment, in a plan view, an area of a first light emitting area of the first sub-pixel may be greater than an area of a second light emitting area of the second sub-pixel, and an area of a third light emitting area of the third sub-pixel may be greater than the area of the second light emitting area.

In an embodiment, the second conductive pattern layer may be comprised of a mesh pattern, and the first sensing electrode array, the second-first sensing electrode and the second-second sensing electrode may be comprised as parts of the mesh pattern that are separated from each other along cut lines.

In an embodiment, the mesh pattern may be comprised of unit opening areas, and in each of the unit opening areas, the second conductive pattern layer may include a first mesh opening that overlaps two first light emitting areas adjacent in the first direction when viewed on a plan view; two second mesh openings which overlap two second light emitting areas, respectively, when viewed on the plan view; and two third mesh openings which overlap two third light emitting areas, respectively, when viewed on the plan view.

In an embodiment, when viewed on the plan view, the dummy contact hole may be located in an intervening area between two first mesh openings included in two unit opening areas adjacent in the first direction.

In an embodiment, each of the second-first sensing electrode and the second-second sensing electrode may have a rectangular shape when viewed on a plan view.

According to an embodiment of the present disclosure, an electronic device includes a processor providing input image data. A display device displays an image on the basis of the input image data. A power supply supplies power to the display device. The display device includes a display layer including pixels. An input sensing layer is disposed on the display layer. The input sensing layer includes a first conductive pattern layer, a second conductive pattern layer and a sensing insulating layer interposed between the first conductive pattern layer and the second conductive pattern layer. The second conductive pattern layer includes a first sensing electrode array extending in a first direction, and second-first and second-second sensing electrodes that are separated from each other in a second direction intersecting the first direction with the first sensing electrode array interposed therebetween. The first conductive pattern layer includes a bridge wiring connected to the second-first and second-second sensing electrodes through bridge contact holes defined in the sensing insulating layer. The bridge wiring is electrically insulated from and intersects the first sensing electrode array. The bridge wiring includes a bridge opening exposing an insulating layer disposed under the bridge wiring. The first sensing electrode array directly contacts the insulating layer exposed by the bridge opening, through a dummy contact hole defined in the sensing insulating layer.

According to an embodiment of the present disclosure, a display device includes a display layer including pixels. An input sensing layer is disposed on the display layer. The input sensing layer includes a first insulating layer disposed on the display layer, a first conductive pattern layer disposed on the first insulating layer, a second insulating layer disposed on the first conductive pattern layer and a second conductive pattern layer disposed on the second insulating layer. Contact holes are defined in the second insulating layer. The second conductive pattern layer includes a first sensing electrode array extending in a first direction and portions of a second sensing electrode array extending in a second direction crossing the first direction. The first conductive pattern layer includes a bridge wiring of the second sensing electrode array. The bridge wiring is connected to the second sensing electrode array of the second conductive pattern layer through bridge contact holes of the contact holes. The bridge wiring is electrically insulated from the first sensing electrode array and overlaps the first sensing electrode array in a plan view. The bridge wiring includes a bridge opening exposing portions of the first insulating layer. The first sensing electrode array directly contacts the portions of the first insulating layer exposed by the bridge opening through at least one dummy contact hole of the contact holes.

In an embodiment, the contact holes are arranged so that a separation distance in the first direction between two contact holes adjacent to each other in the first direction is constant. The contact holes are arranged so that a separation distance in the second direction between two contact holes adjacent to each other in the second direction is constant.

In an embodiment, the bridge opening surrounds two dummy contact holes in the plan view.

In the display device and the electronic device including the same according to embodiments of the present disclosure, by imparting regularity to the arrangement of contact holes formed in a sensing insulating layer, the visibility of a reflected pattern appearing by reflected light reflected by the contact holes may be significantly reduced. At the same time, by adopting a structure in which a bridge wiring includes a bridge opening and a first sensing electrode array contacts, through a dummy contact hole formed in the sensing insulating layer, an insulating layer exposed by the bridge opening, the insulation of the bridge wiring and the first sensing electrode array may be secured while implementing the above-described regular arrangement of the contact holes.

BRIEF DESCRIPTION OF THE DRAWINGS

FIGS. 8 to 11 are plan views illustrating a display device according to embodiments of the present disclosure.

Figure 20:
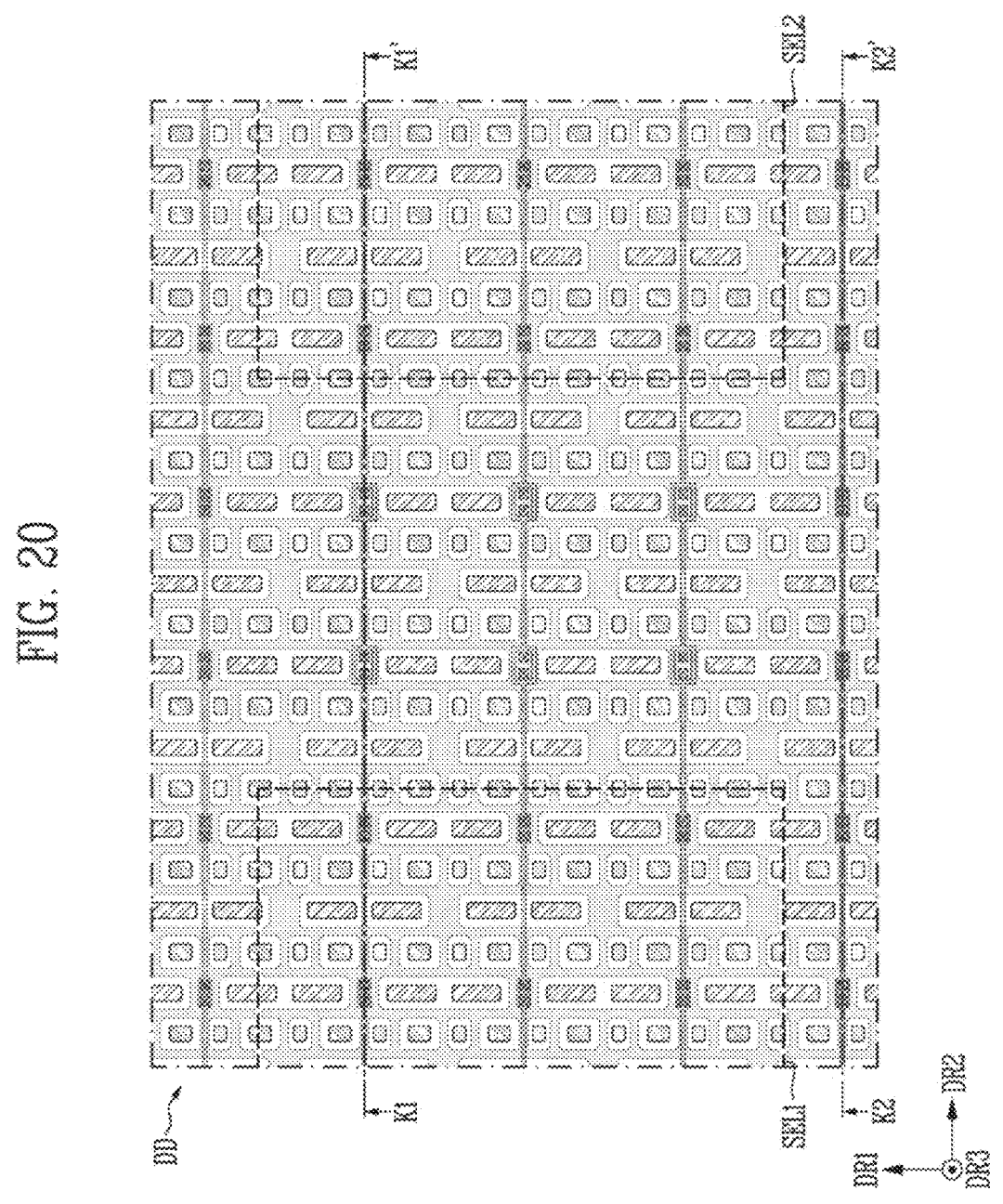
Figure 23:
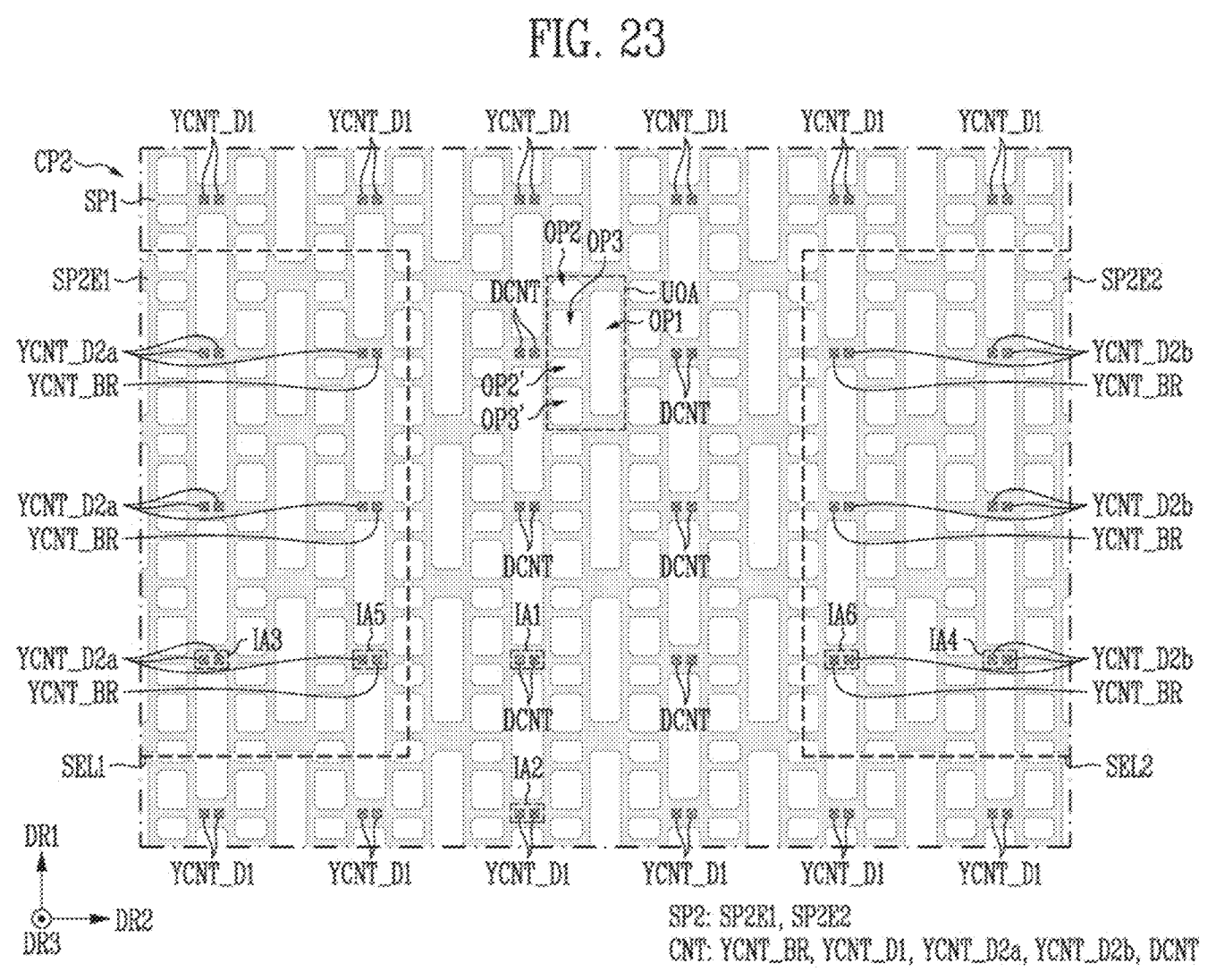

FIGS. 20 to 23 are plan views illustrating a display device according to embodiments of the present disclosure.

DETAILED DESCRIPTION OF EMBODIMENTS

Figure 1:
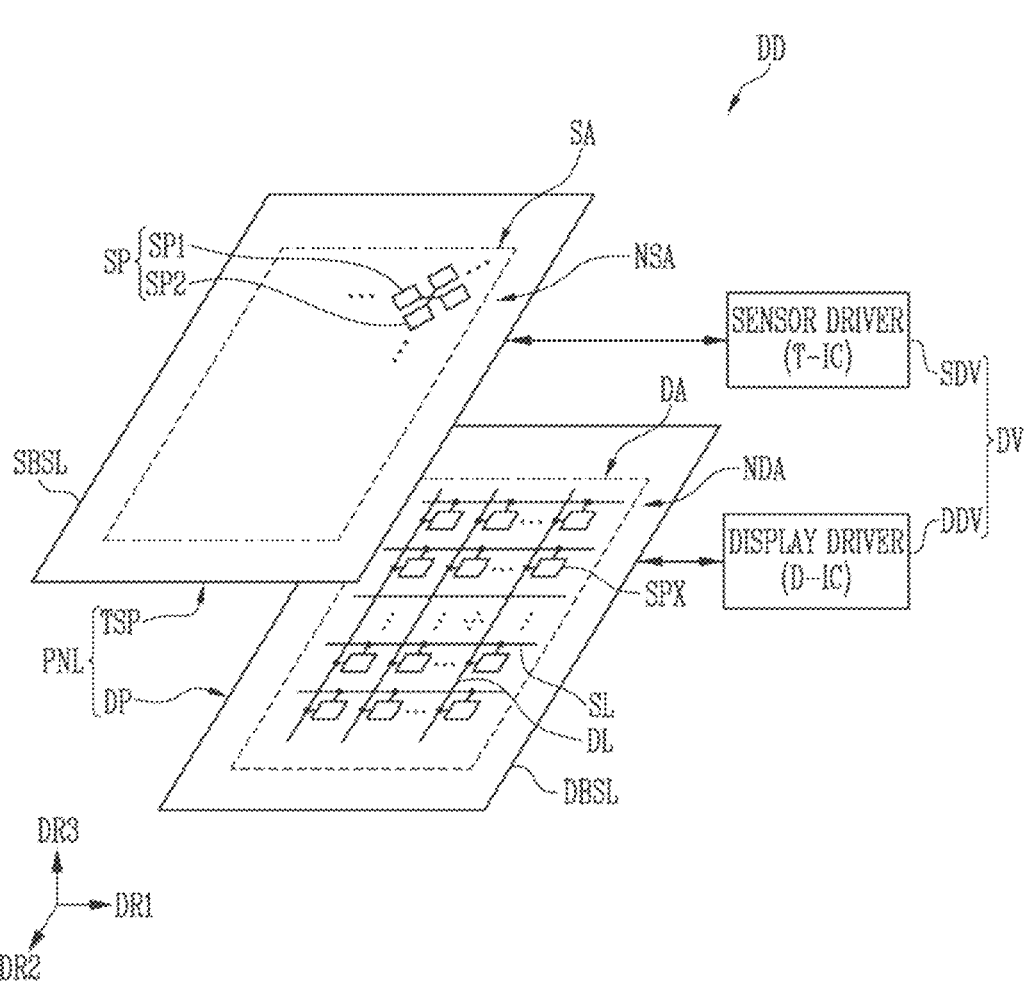
FIG. 1 is a diagram illustrating a display device according to an embodiment of the present disclosure.

Hereafter, non-limiting embodiments of the present disclosure will be described in detail with reference to the accompanying drawings. The following descriptions will be focused on only portions required for understanding operations in accordance with embodiments of the present disclosure, and the descriptions of the other portions may be omitted to avoid unnecessarily obscuring the subject matters of the present disclosure. However, embodiments of the present disclosure are not limited to the embodiments described herein, but may be embodied in different forms. The embodiments described in this specification are only provided to describe the present disclosure in detail, such that the technical idea of the present disclosure can be easily carried out by those skilled in the art to which the present disclosure pertains.

Throughout the specification, when one element is referred to as being "connected" to another element, it may not only indicate that the former element is "directly connected" to the latter element, but may also indicate that the former element is "indirectly connected" to the latter element with another element interposed therebetween. The terms used herein are provided to describe specific embodiments and are not intended to limit the present disclosure. Throughout the specification, when an element "includes" a component, it may indicate that the element does not exclude another component unless referred to the contrary, but can further include another component. "At least any one of X, Y and Z" and "at least any one selected from an array consisting of X, Y and Z" may be construed as each of X, Y and Z or a combination of two or more of X, Y and Z (for example, XYZ, XYY, YZ and ZZ). As used herein, the term "and/or" includes any and all combinations of one or more of associated listed items.

Although the terms "first," "second," etc. may be used herein to describe various components, these components are not limited by these terms. These terms are used to distinguish one component from another component. Thus, a first component could be termed a second component without departing from the teachings of the present disclosure.

Spatially relative terms, such as "under," "on" and the like, may be used herein for descriptive purposes, and, thereby, to describe one element or feature's relationship to another element(s) or feature(s) as illustrated in the drawings. Spatially relative terms are intended to encompass different directions in use, operation, and/or manufacture in addition to the direction depicted in the drawings. For example, if a device depicted in drawings is turned over, elements described as being located "under" other elements or features would then be located "on" the other elements or features. Thus, the "under" can encompass both directions of on and under. Furthermore, the device may be otherwise oriented (e.g., rotated 90 degrees or in other directions), and, as such, the spatially relative terms used herein are interpreted accordingly.

Various embodiments will be described herein with reference to drawings. However, embodiments of the present disclosure include variations in the shapes of the illustrations, such as, for example, as a result of tolerances and/or manufacturing techniques. Thus, the described embodiments should not be construed as being limited to the particular illustrated shapes, but should be construed as including changes in shapes that result from, for instance, manufacturing. In this manner, shapes illustrated in the drawings may not illustrate the actual shapes of regions of the device, and the embodiments are not necessarily limited thereto.

Figure 2:
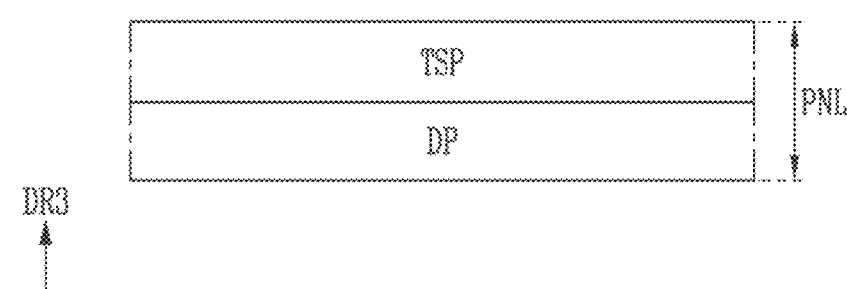
FIG. 2 is a cross-sectional view illustrating a display panel of FIG. 1 according to an embodiment of the present disclosure.

FIG. 1 is a diagram illustrating a display device according to an embodiment of the present disclosure. FIG. 2 is a cross-sectional view illustrating a display panel of FIG. 1.

Referring to FIGS. 1 and 2, the display device DD may include a display panel PNL and a driving circuit DV. The display panel PNL may include a display layer DP and an input sensing layer TSP. The driving circuit DV may include a display driver DDV and a sensor driver SDV.

The display layer DP may include a display base layer DBSL and sub-pixels SPX which are disposed on the display base layer DBSL.

The display base layer DBSL may be a base substrate or a base member for supporting the display device DD. In an embodiment, the display base layer DBSL may be a rigid substrate made of glass. Alternatively, the display base layer DBSL may be a flexible substrate which is capable of bending, folding, rolling, etc. In this embodiment, the display base layer DBSL may include an insulating material such as a polymer resin such as polyimide (PI). However, embodiments of the present disclosure are not necessarily limited thereto and the material of the display base layer DBSL may vary.

The display base layer DBSL may include a display area DA in which an image is displayed and a non-display area NDA which is an area other than the display area DA and where an image may not be displayed.

In the display area DA, scan lines SL, data lines DL and the sub-pixels SPX which are connected to the scan lines SL and the data lines DL may be disposed. In an embodiment, the sub-pixels SPX may be configured to be selected by a scan signal of a turn-on level supplied from the scan lines SL, to thereby be supplied with a data signal from the data lines DL and to emit light of a luminance corresponding to the data signal. Accordingly, an image corresponding to the data signal may be displayed in the display area DA.

Various wirings and/or embedded circuits which are connected to the sub-pixels SPX of the display area DA may be disposed in the non-display area NDA. For example, various wirings for supplying various power and control signals to the display area DA may be disposed in the non-display area NDA. In an embodiment, some wirings of the wirings may be connected to the display driver DDV.

As such, the display layer DP may be configured to output visual information (e.g., at least one moving image and/or still image). In the present disclosure, the type/kind of the display layer DP is not particularly limited. For example, in an embodiment the display layer DP may be implemented by a self-emission type panel such as an organic light emitting display panel. However, when the display layer DP is implemented as a self-emission type, each sub-pixel SPX is not necessarily limited to including an organic light emitting element. For example, each sub-pixel SPX may include an organic light emitting diode, an inorganic light emitting diode or a quantum dot/well light emitting diode. According to an embodiment, the display layer DP may be implemented by a non-emission type display panel such as a liquid crystal display panel. In an embodiment in which the display layer DP is implemented as a non-emission type, the display device DD may additionally include a light source such as a backlight unit.

In the following description of embodiments of the present disclosure, for the sake of convenience of explanation, description will be made on the basis of an embodiment in which the display layer DP is implemented by an organic light emitting display panel. However, embodiments of the present disclosure are not necessarily limited thereto.

In an embodiment, the input sensing layer TSP may include a sensor base layer SBSL and a sensing electrode array SP which is disposed on the sensor base layer SBSL.

The sensor base layer SBSL may include one or more insulating layers. For example, in an embodiment a first insulating layer INS1 (see FIG. 4) for forming the sensor base layer SBSL may be disposed on the display layer DP to form a base for forming the sensing electrode array SP. However, the material of the sensor base layer SBSL may vary and is not necessarily limited to a particular material.

The sensor base layer SBSL may include a sensing area SA capable of sensing a touch input or the like and a non-sensing area NSA which is an area other than the sensing area SA in which a touch input or the like may not be sensed. In an embodiment, the sensing area SA may be disposed to overlap at least a portion of the display area DA (e.g., in the third direction DR3). For example, in an embodiment the sensing area SA may substantially completely overlap the display area DA, and the non-sensing area NSA may at least partially overlap the non-display area NDA. In this embodiment, when a touch input or the like is provided on the display area DA, the touch input may be sensed through the input sensing layer TSP.

The sensing electrode array SP for sensing a touch input or the like may be disposed in the sensing area SA. The sensing electrode array SP may obtain information on an input provided from a user (e.g., the location of the input). For example, in an embodiment the sensing electrode array SP may be implemented in any one scheme of a variety of known schemes such as a capacitive sensing scheme, a mutual capacitance scheme and a self-capacitance scheme, to obtain information on an input provided from a user.

In an embodiment, the sensing electrode array SP may include a first sensing electrode array SP1 and a second sensing electrode array SP2. The first sensing electrode array SP1 may extend in a first direction DR1. In an embodiment, a plurality of first sensing electrode arrays SP1 may be provided, and in this embodiment, the first sensing electrode arrays SP1 may be arranged in a second direction DR2 intersecting the first direction DR1. The second sensing electrode array SP2 may extend in the second direction DR2. A plurality of second sensing electrode arrays SP2 may be provided, and in this embodiment, the second sensing electrode arrays SP2 may be arranged in the first direction DR1. The first sensing electrode arrays SP1 and the second sensing electrode arrays SP2 may intersect each other by being insulated (e.g., electrically insulated) from each other.

In an embodiment, the first sensing electrode array SP1 may include transmitter (Tx) pattern electrodes, and the second sensing electrode array SP2 may include receiver (Rx) pattern electrodes. However, depending on an embodiment (e.g., the self-capacitance scheme), the sensing electrode array SP may be configured as a single type without distinction between the first sensing electrode array SP1 and the second sensing electrode array SP2.

In the non-sensing area NSA, sensing lines for electrically connecting the sensing electrode array SP to the sensor driver SDV may be disposed.

The display driver DDV may be configured to be electrically connected to the display layer DP so as to drive the sub-pixels SPX. The sensor driver SDV may be configured to be electrically connected to the input sensing layer TSP so as to drive the input sensing layer TSP.

Figure 3:
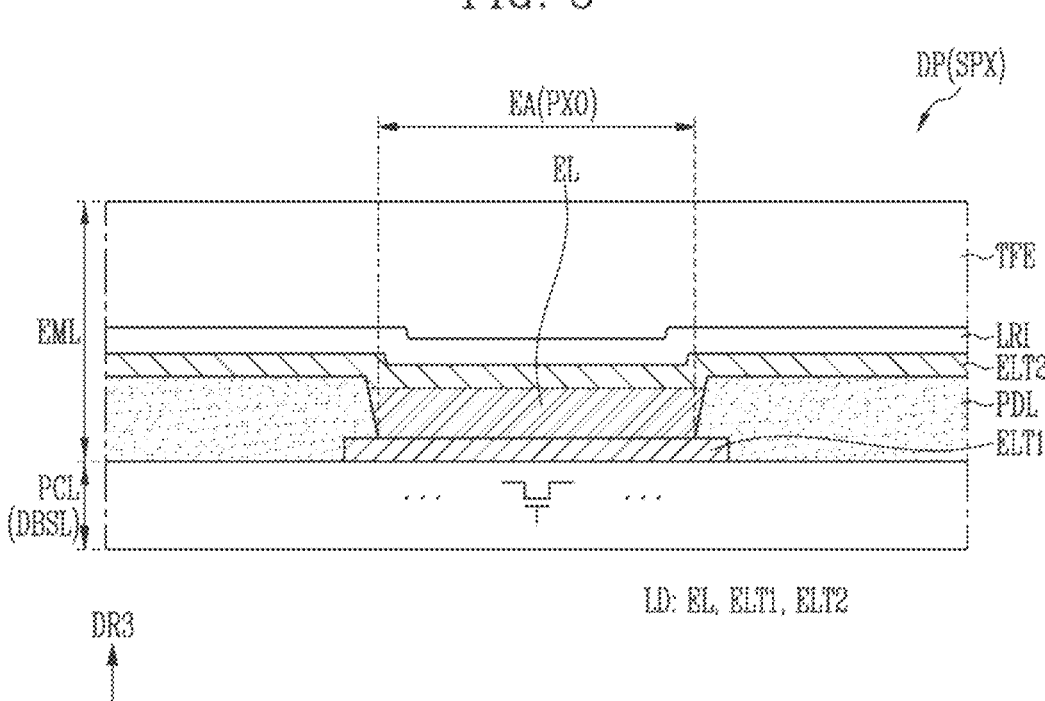
FIG. 3 is a cross-sectional view illustrating a display layer of FIG. 2 according to an embodiment of the present disclosure.

FIG. 3 is a cross-sectional view illustrating the display layer of FIG. 2 according to an embodiment of the present disclosure.

Referring to FIG. 3, a cross-sectional shape corresponding to one sub-pixel SPX among the sub-pixels SPX described above with reference to FIG. 1 is illustrated as an example. Sub-pixels SPX other than the specific sub-pixel SPX illustrated in FIG. 3 may also have a cross-sectional shape substantially the same as or similar to the cross-sectional shape illustrated in FIG. 3.

The display layer DP may include a pixel circuit layer PCL and a light emitting element layer EML.

In an embodiment, the pixel circuit layer PCL may include the display base layer DBSL, conductive layers, one or more semiconductor layers, and insulating layers interposed between the conductive layers and the semiconductor layers. The components included in the pixel circuit layer PCL may form a pixel circuit. The pixel circuit may include a switching element and a driving transistor. In an embodiment, the switching element may be implemented by, for example, a thin film transistor (TFT). The pixel circuit may serve to generate an electrical signal necessary for a light emitting element LD to generate light. The pixel circuit may be electrically connected to the light emitting element LD to provide the electrical signal to the light emitting element LD.

The light emitting element layer EML may be disposed on the pixel circuit layer PCL (e.g., in the third direction DR3). In an embodiment, the light emitting element layer EML may include the light emitting element LD, a pixel defining layer PDL, a low reflection inorganic layer LRI, and an encapsulation layer TFE. The light emitting element LD may include a first electrode ELT1, a light emitting layer EL and a second electrode ELT2 (e.g., arranged in the third direction DR3).

The first electrode ELT1 may be disposed on the pixel circuit layer PCL (e.g., disposed directly thereon in the third direction DR3). The first electrode ELT1 may be electrically connected to the switching element which constitutes the pixel circuit, to receive an electrical signal provided from the pixel circuit. In an embodiment, the first electrode ELT1 may be referred to as an anode electrode. In an embodiment, the first electrode ELT1 may include a light-reflective conductive material, and accordingly, the light emission efficiency of light emitted from the light emitting layer EL may be increased. However, embodiments of the present disclosure are not necessarily limited thereto and the material of the first electrode ELT1 may vary.

The pixel defining layer PDL may be disposed on (e.g., disposed directly thereon) the pixel circuit layer PCL and the first electrode ELT1. The pixel defining layer PDL may include a pixel opening PXO which exposes at least a portion of the first electrode ELT1. For example, in an embodiment the pixel defining layer PDL may directly contact ends of the first electrode ELT1 and expose a central portion of the first electrode ELT1. In an embodiment, the pixel defining layer PDL may include at least one material selected from the group consisting of acrylic resin, epoxy resin, phenol resin, polyamide resin and polyimide resin. However, embodiments of the present disclosure are not necessarily limited thereto and the material of the pixel defining layer PDL may vary. For example, the pixel defining layer PDL may include an inorganic material.

The light emitting layer EL may be disposed on the first electrode ELT1 in the pixel opening PXO of the pixel defining layer PDL (e.g., in the third direction DR3). The light emitting layer EL may have a multilayer thin film structure which includes a light generation layer. In an embodiment, the light emitting layer EL may include a hole injection layer, a hole transport layer, an organic light emitting layer, a hole blocking layer, an electron transport layer and an electron injection layer which are sequentially stacked in the third direction DR3.

The second electrode ELT2 may be disposed on the pixel defining layer PDL and the light emitting layer EL (e.g., in the third direction DR3). The second electrode ELT2 may receive a common voltage which is provided from the embedded circuit or the display driver DDV (see FIG. 1) disposed in the non-display area NDA (see FIG. 1). In an embodiment, the second electrode ELT2 may be referred to as a cathode electrode. In an embodiment, the second electrode ELT2 may include a substantially transparent or translucent conductive material to satisfy a predetermined light transmittance. In an embodiment, the second electrode ELT2 may be disposed in common across a plurality of sub-pixels SPX. However, embodiments of the present disclosure are not necessarily limited thereto.

The light emitting layer EL may generate and emit light on the basis of electrical signals provided from the first electrode ELT1 and the second electrode ELT2. In this embodiment, an area where light emitted from the light emitting layer EL is actually visible may be referred to as a light emitting area EA. For example, the light emitting area EA may be an area which is substantially identical to, or similar to, an area where the pixel opening PXO is defined.

The low reflection inorganic layer LRI may be disposed on the second electrode ELT2 (e.g., disposed directly thereon in the third direction DR3). The low reflection inorganic layer LRI may absorb light incident into the display layer DP from the outside (e.g., the external environment), and may reduce the external light reflectance of the display device DD. In an embodiment, the low reflection inorganic layer LRI may be composed of an inorganic material including at least one of a metal or a metal compound, taking into account refractive index and light absorption coefficient. However, embodiments of the present disclosure are not necessarily limited thereto and the material of the low reflection inorganic layer LRI may vary. In some embodiments, the low reflection inorganic layer LRI may be omitted.

The encapsulation layer TFE may be disposed on the low reflection inorganic layer LRI (e.g., disposed directly thereon in the third direction DR3). The upper surface of the encapsulation layer TFE may be substantially flat. Accordingly, the encapsulation layer TFE may serve to compensate for a level difference caused by the light emitting element LD and the pixel defining layer PDL with respect to a component (e.g., the input sensing layer TSP of FIG. 4) disposed on the encapsulation layer TFE. In an embodiment, the encapsulation layer TFE may include a first inorganic encapsulation layer, an organic encapsulation layer and a second inorganic encapsulation layer which are sequentially stacked in the third direction DR3. In this embodiment, the encapsulation layer TFE may serve to protect the components disposed under the encapsulation layer TFE from external impurities (e.g., moisture, gas, etc.).

Figure 4:
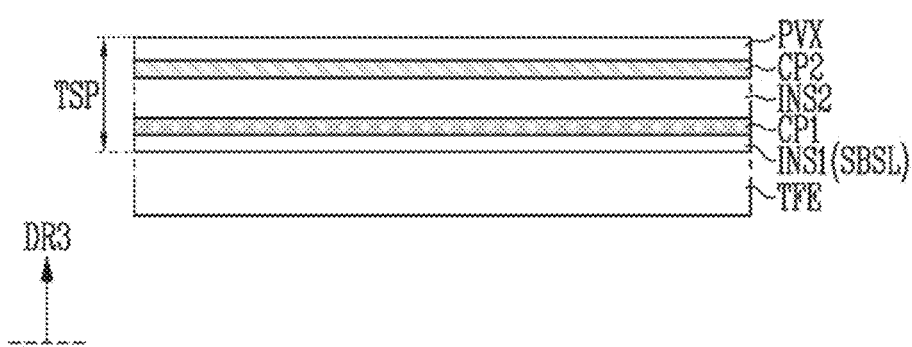
FIG. 4 is a cross-sectional view illustrating an input sensing layer of FIG. 2 according to an embodiment of the present disclosure.

FIG. 4 is a cross-sectional view illustrating the input sensing layer of FIG. 2.

Referring to FIG. 4, the input sensing layer TSP may be disposed on the encapsulation layer TFE. In an embodiment, the input sensing layer TSP may be disposed directly on the encapsulation layer TFE (e.g., in the third direction DR3).

In an embodiment, the input sensing layer TSP may include a first insulating layer INS1, a first conductive pattern layer CP1, a second insulating layer INS2, a second conductive pattern layer CP2 and a protective layer PVX which are sequentially stacked in the third direction DR3.

In an embodiment, the first insulating layer INS1 may be disposed on the encapsulation layer TFE (e.g., disposed directly thereon in the third direction DR3). The first insulating layer INS1 may form the sensor base layer SBSL, and thereby, may serve to provide a base on which the first conductive pattern layer CP1, the second insulating layer INS2, the second conductive pattern layer CP2 and the protective layer PVX are to be disposed.

In an embodiment, the first conductive pattern layer CP1 may be disposed on the first insulating layer INS1 (e.g., disposed directly thereon in the third direction DR3). The second conductive pattern layer CP2 may be disposed on the second insulating layer INS2 (e.g., disposed directly thereon in the third direction DR3). The second insulating layer INS2 may be interposed between the first conductive pattern layer CP1 and the second conductive pattern layer CP2 (e.g., in the third direction DR3). The protective layer PVX may be disposed on the second conductive pattern layer CP2 (e.g., disposed directly thereon in the third direction DR3). In an embodiment, the second insulating layer INS2 may be referred to as a sensing insulating layer.

The first conductive pattern layer CP1 and the second conductive pattern layer CP2 may include single-layered or multi-layered metal layers. In an embodiment, the first conductive pattern layer CP1 and the second conductive pattern layer CP2 may include at least one or an alloy of various metal materials including gold (Au), silver (Ag), aluminum (Al), molybdenum (Mo), chromium (Cr), titanium (Ti), nickel (Ni), neodymium (Nd), copper (Cu) and platinum (Pt). According to an embodiment, the first conductive pattern layer CP1 and the second conductive pattern layer CP2 may include at least one of various transparent conductive materials including silver nanowire (AgNW), indium tin oxide (ITO), indium zinc oxide (IZO), indium gallium zinc oxide (IGZO), antimony zinc oxide (AZO), indium tin zinc oxide (ITZO), zinc oxide (ZnO), tin oxide (SnO2), carbon nanotube (CNT) and graphene. However, embodiments of the present disclosure are not necessarily limited thereto.

The first insulating layer INS1, the second insulating layer INS2 and the protective layer PVX may include an inorganic insulating material and/or an organic insulating material. In an embodiment, the inorganic insulating material may be at least one selected from the group consisting of, for example, silicon nitride, silicon oxide, silicon oxynitride and aluminum oxide. The organic insulating material may be at least one selected from the group consisting of, for example, acrylic resin, epoxy resin, phenol resin, polyamide resin and polyimide resin. However, the materials of the first insulating layer INS1, the second insulating layer INS2 and the protective layer PVX are not necessarily limited thereto.

In an embodiment, the second insulating layer INS2 may include an organic material. In an embodiment in which the second insulating layer INS2 includes an organic material, the risk of a short circuit between the first conductive pattern layer CP1 and the second conductive pattern layer CP2 may be reduced. Accordingly, a structural risk may be reduced even when the thickness of at least one of the first conductive pattern layer CP1 and the second conductive pattern layer CP2 is increased. According to this fact, the degree of freedom in process design may be increased.

Figure 5:
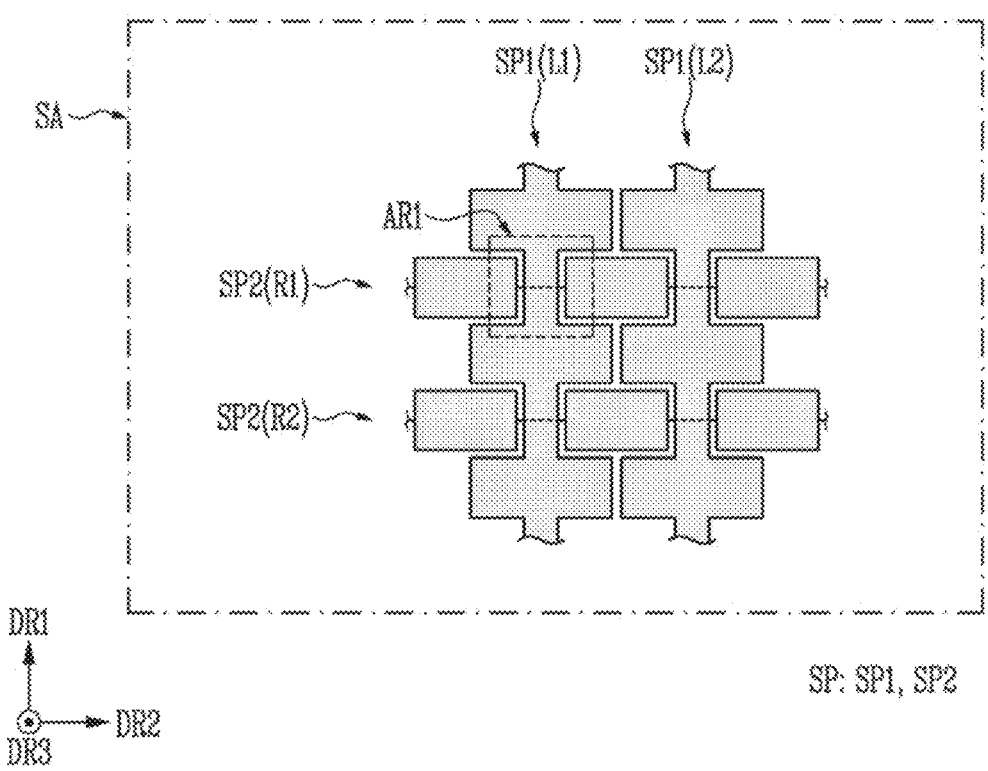
FIG. 5 is a plan view illustrating a sensing electrode array disposed in a sensing area of FIG. 1 according to an embodiment of the present disclosure.
Figure 6:
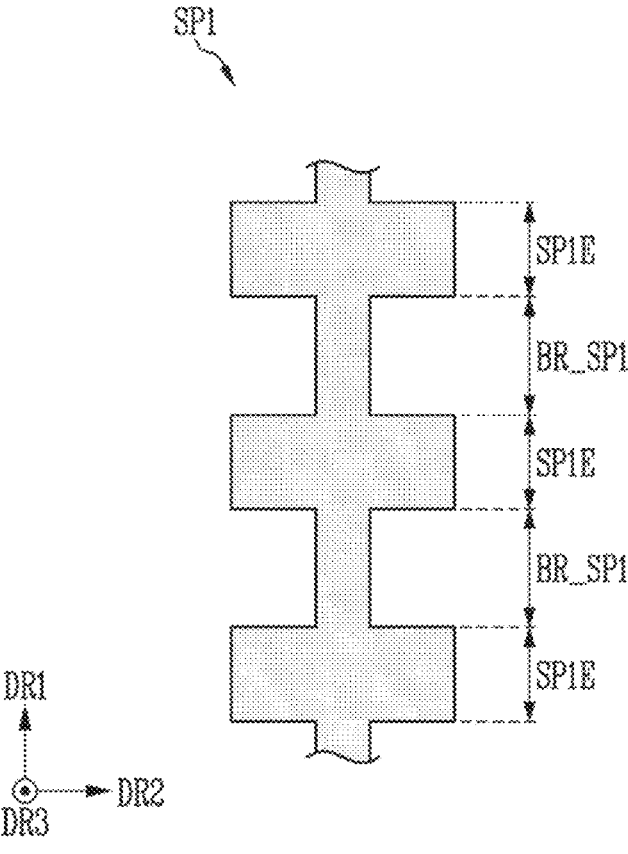
FIG. 6 is a diagram illustrating a first sensing electrode array of FIG. 5 according to an embodiment of the present disclosure.
Figure 7:
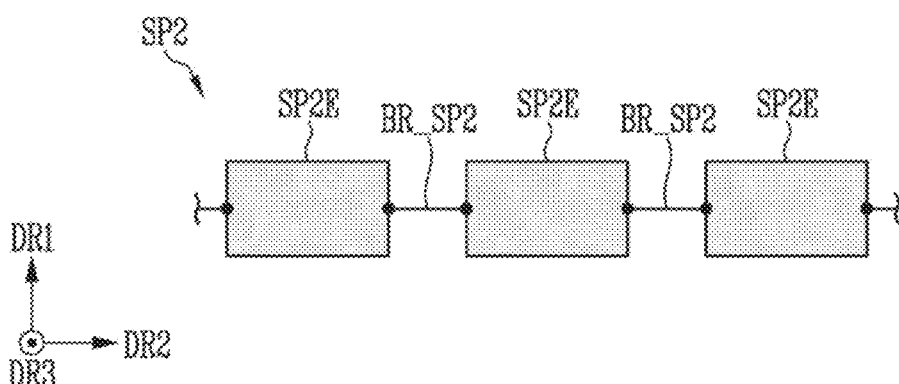
FIG. 7 is a diagram illustrating a second sensing electrode array of FIG. 5 according to an embodiment of the present disclosure.

FIG. 5 is a plan view illustrating the sensing electrode array disposed in the sensing area of FIG. 1. FIG. 6 is a drawing illustrating the first sensing electrode array of FIG. 5. FIG. 7 is a drawing illustrating the second sensing electrode array of FIG. 5.

Referring to FIG. 5, the input sensing layer TSP (see FIG. 4) may include the sensing electrode array SP which is disposed in the sensing area SA. In an embodiment, the sensing electrode array SP may include the first sensing electrode array SP1 and the second sensing electrode array SP2.

Referring to FIG. 6, the first sensing electrode array SP1 may extend longitudinally in the first direction DR1. The first sensing electrode array SP1 may include first sensing electrodes SPIE and bridge portions BR_SP1. In an embodiment, the first sensing electrodes SPIE and the bridge portions BR_SP1 which constitute the first sensing electrode array SP1 may be implemented as the second conductive pattern layer CP2 of FIG. 4.

In an embodiment, the first sensing electrodes SPIE may be, for example, transmitter (Tx) pattern electrodes. The first sensing electrodes SPIE may be arranged in the first direction DR1. For example, adjacent first sensing electrodes SPIE may be spaced apart from each other in the first direction DR1 with the bridge portions BR_SP1 disposed therebetween.

The bridge portions BR_SP1 may electrically connect adjacent first sensing electrodes SPIE among the first sensing electrodes SPIE. In an embodiment, the width of each of the bridge portions BR_SP1 in the second direction DR2 may be less than the width of each of the first sensing electrodes SPIE in the second direction DR2.

Referring to FIG. 7, the second sensing electrode array SP2 may extend longitudinally in the second direction DR2. The second sensing electrode array SP2 may include second sensing electrodes SP2E and bridge wirings BR_SP2. In an embodiment, the second sensing electrodes SP2E may be implemented as the second conductive pattern layer CP2 of FIG. 4, and the bridge wirings BR_SP2 may be implemented as the first conductive pattern layer CP1 of FIG. 4.

In an embodiment, the second sensing electrodes SP2E may be, for example, receiver (Rx) pattern electrodes. The second sensing electrodes SP2E may be arranged in the second direction DR2. For example, in an embodiment adjacent second sensing electrodes SP2E may be spaced apart from each other in the second direction DR2 with the bridge wirings BR_SP2 disposed therebetween. In an embodiment, each of the second sensing electrodes SP2E may have a rectangular shape when viewed on a plan view. In this embodiment, the width of each of the second sensing electrodes SP2E in the second direction DR2 may be greater than the width thereof in the first direction DR1.

The bridge wirings BR_SP2 may electrically connect adjacent second sensing electrodes SP2E among the second sensing electrodes SP2E to each other. In an embodiment, the bridge wirings BR_SP2 may be connected to the second sensing electrodes SP2E through bridge contact holes YCNT_BR (see FIG. 12) which are formed in the second insulating layer INS2 of FIG. 4.

Referring again to FIG. 5, a plurality of first sensing electrode arrays SP1 may be provided, and a plurality of second sensing electrode arrays SP2 may be provided. The first sensing electrode arrays SP1 may be arranged in the second direction DR2, and the second sensing electrode arrays SP2 may be arranged in the first direction DR1. For example, in an embodiment the first sensing electrode arrays SP1 may include a first sensing electrode array SP1 which is arranged in a first column L1 and a first sensing electrode array SP1 which is arranged in a second column L2 adjacent to the first column L1 (e.g., in the second direction DR2). For example, the second sensing electrode arrays SP2 may include a second sensing electrode array SP2 which is arranged in a first row R1 and a second sensing electrode array SP2 which is arranged in a second row R2 adjacent to the first row R1 (e.g., in the first direction DR1).

In an embodiment, the first sensing electrode arrays SP1 and the second sensing electrode arrays SP2 may be disposed to intersect each other by being insulated (e.g., electrically insulated) from each other, so as to fill the sensing area SA substantially without any gaps. For example, the first sensing electrode arrays SP1 and the second sensing electrodes SP2E which are implemented as the second conductive pattern layer CP2 of FIG. 4 may be separated from each other when viewed on a plan view. In this embodiment, the bridge wirings BR_SP2 which are implemented as the first conductive pattern layer CP1 of FIG. 4 may be disposed to partially overlap and intersect the bridge portions BR_SP1 in an insulated state when viewed on a plan view.

Figure 12:
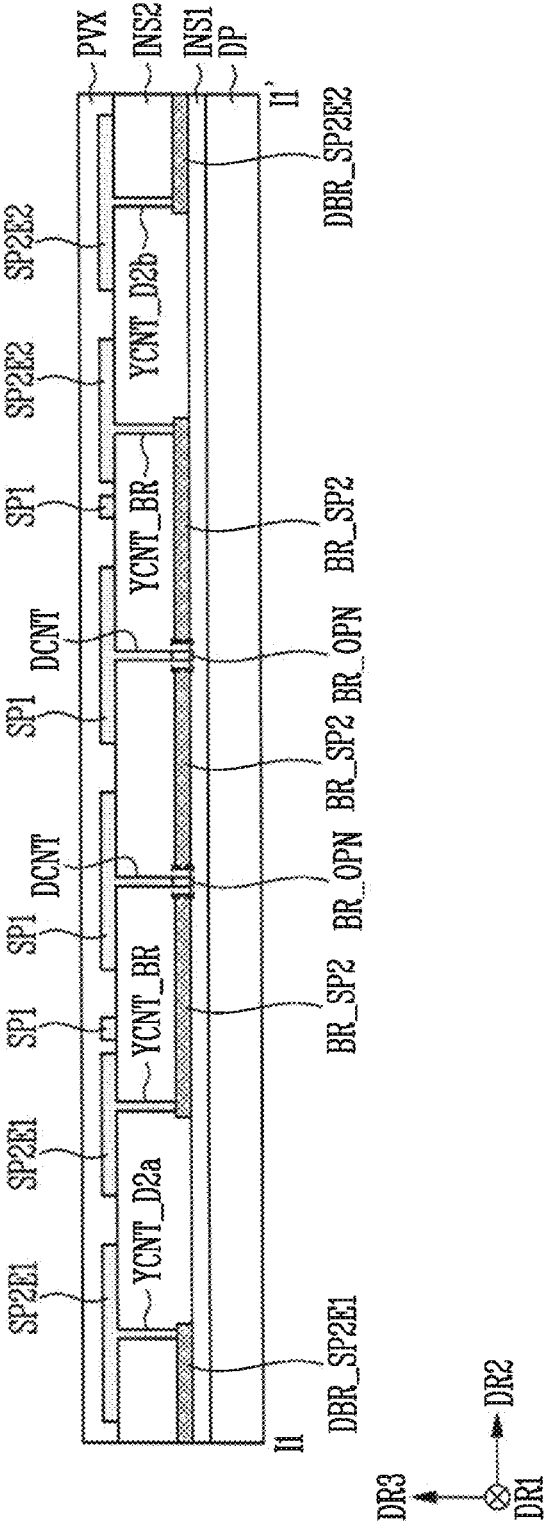
FIG. 12 is a cross-sectional view taken along the line I1-I1' of FIG. 8 according to an embodiment of the present disclosure.
Figure 13:
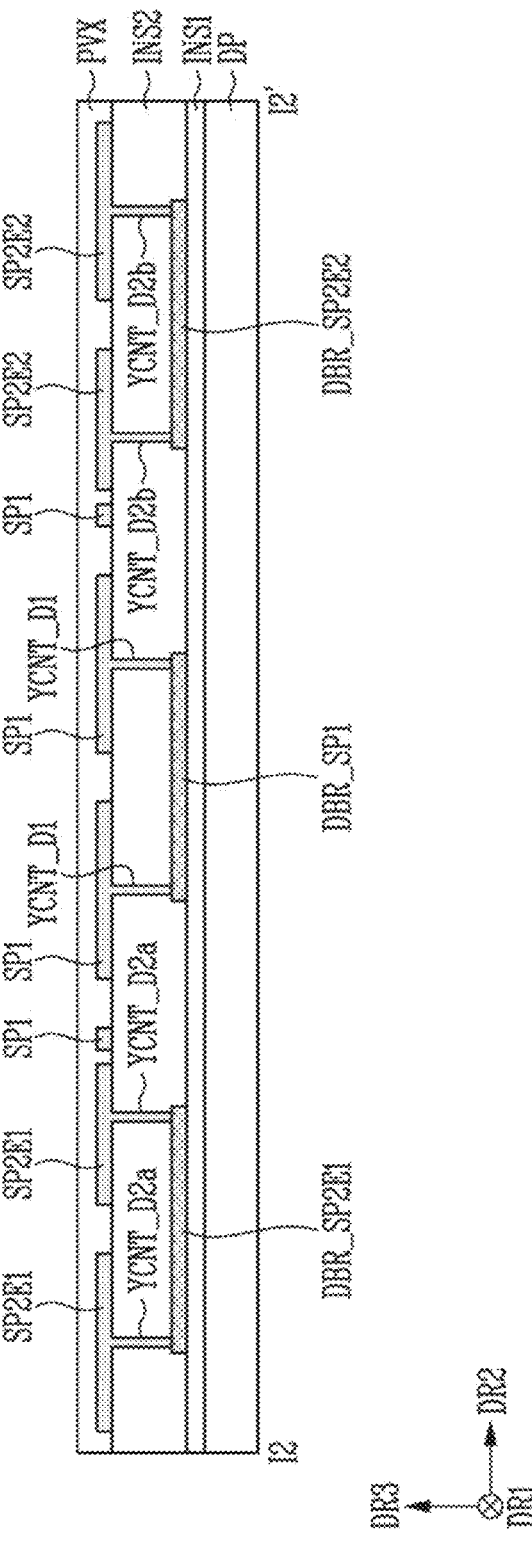
FIG. 13 is a cross-sectional view taken along the line I2-I2' of FIG. 8 according to an embodiment of the present disclosure.
Figure 14:
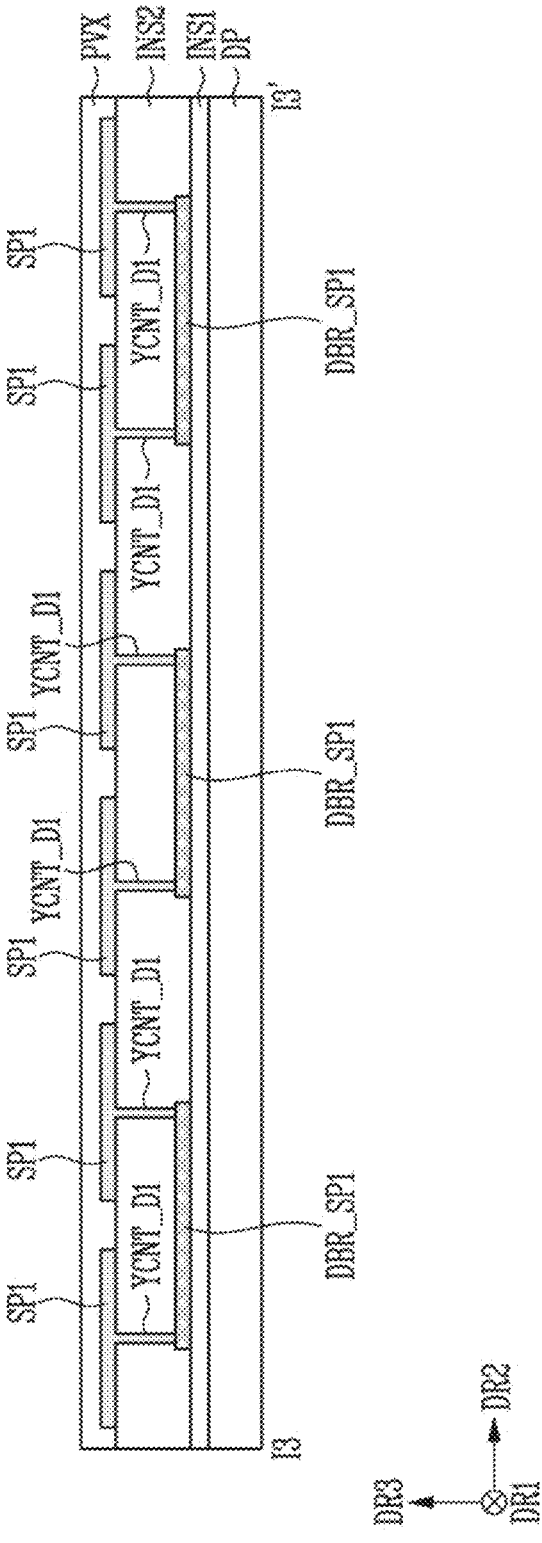
FIG. 14 is a cross-sectional view taken along the line I3-I3' of FIG. 8 according to an embodiment of the present disclosure.

FIGS. 8 to 11 are plan views illustrating a display device according to embodiments of the present disclosure. FIG. 12 is a cross-sectional view taken along the line I1-I1' of FIG. 8. FIG. 13 is a cross-sectional view taken along the line I2-I2' of FIG. 8. FIG. 14 is a cross-sectional view taken along the line I3-I3' of FIG. 8.

FIGS. 8 to 11 are enlarged plan views of a partial area of the display area DA and the sensing area SA overlapping the display area DA described above with reference to FIG. 1. FIGS. 8 to 11 illustrate components which are disposed in the partial area. The partial area may be an area corresponding to an area AR1 of FIG. 5.

Figure 8:
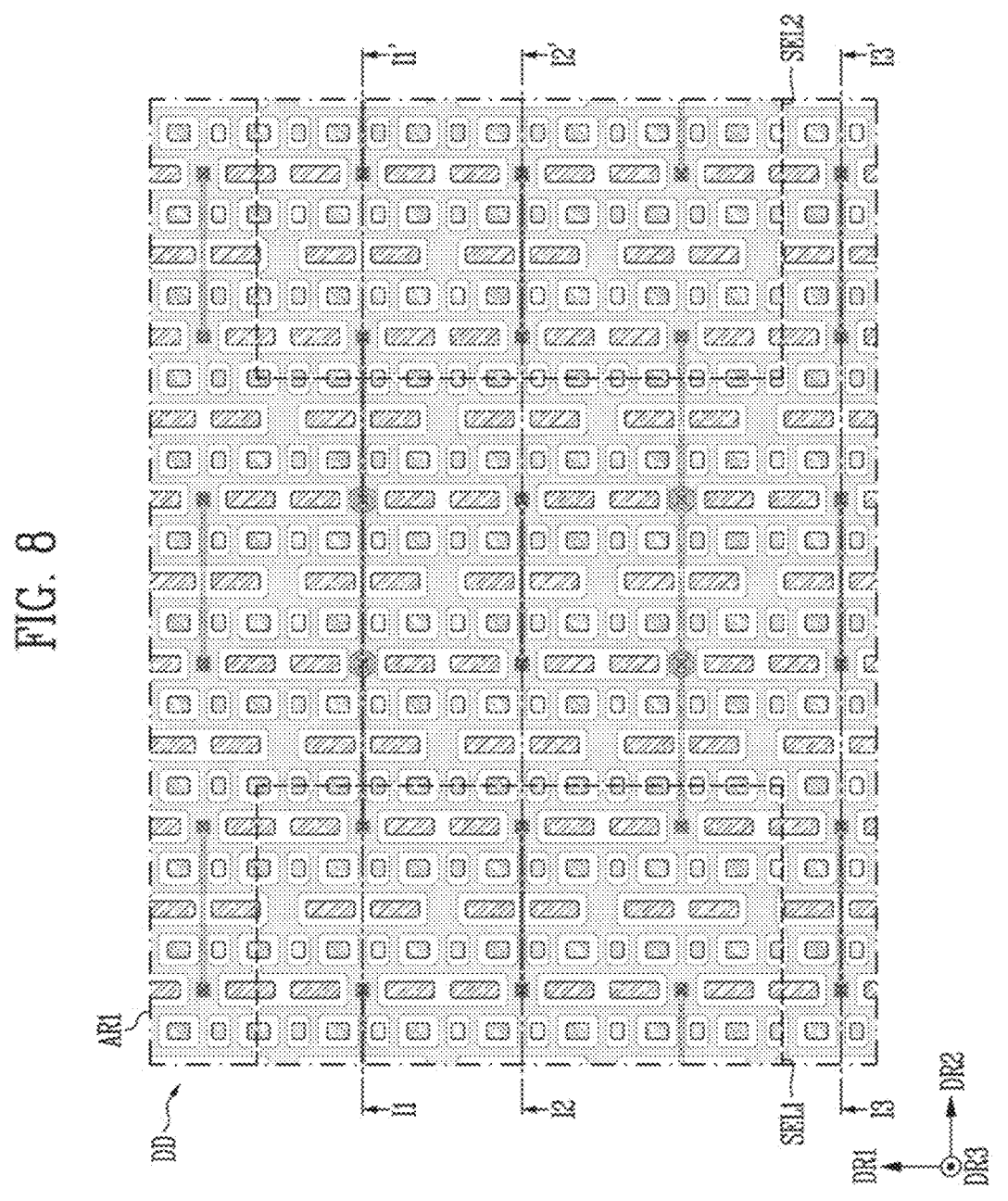
Figure 9:
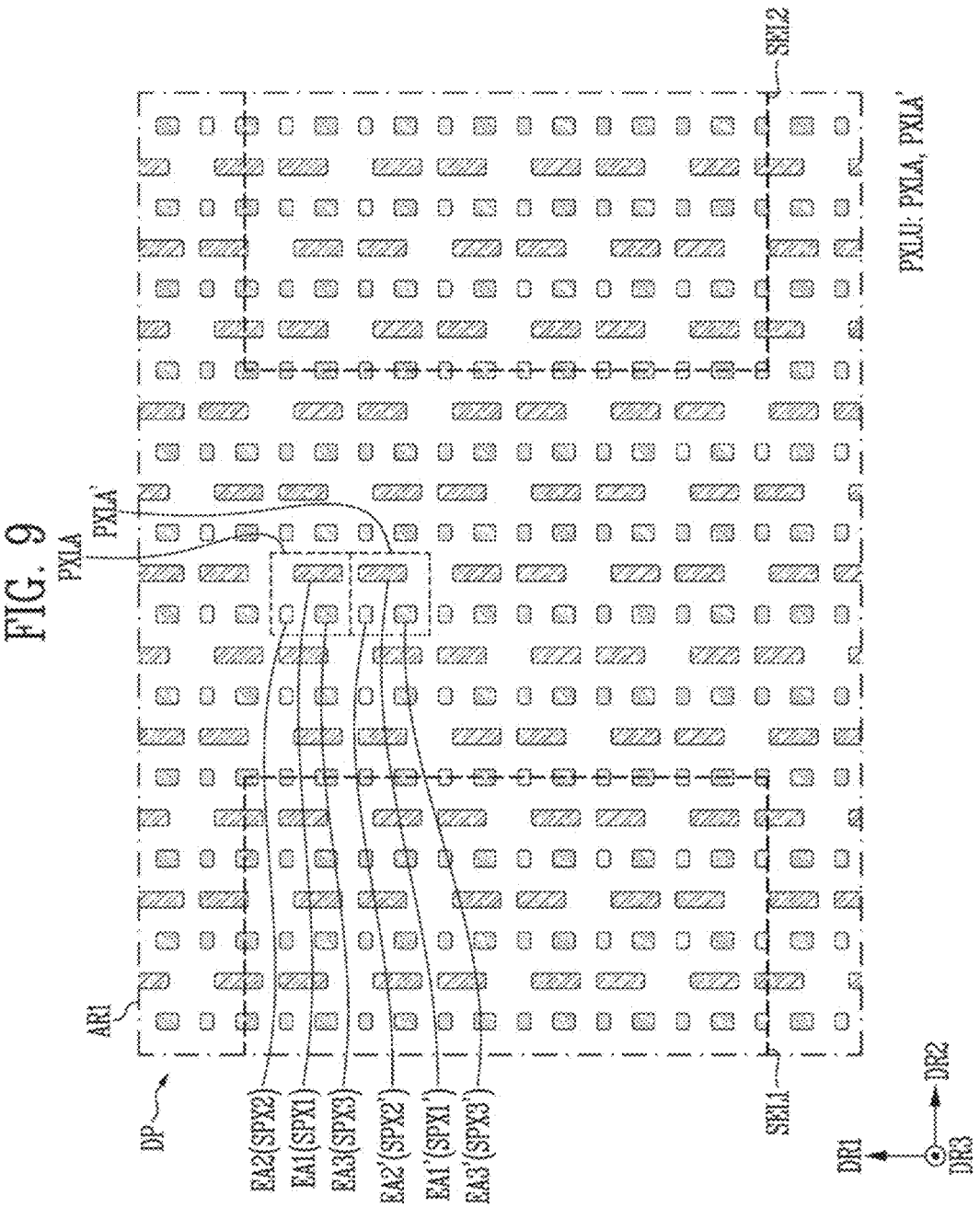
Figure 10:
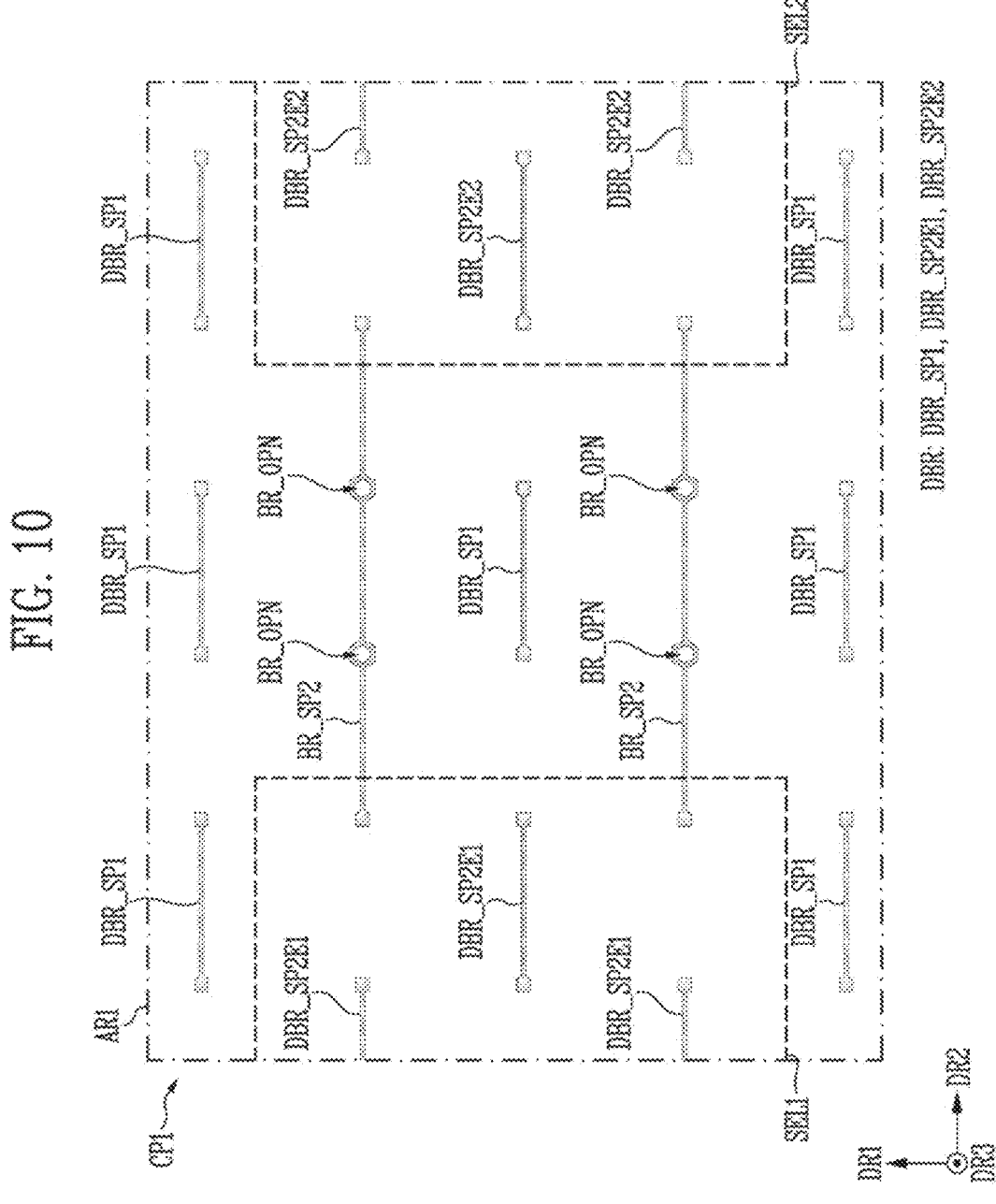
Figure 11:
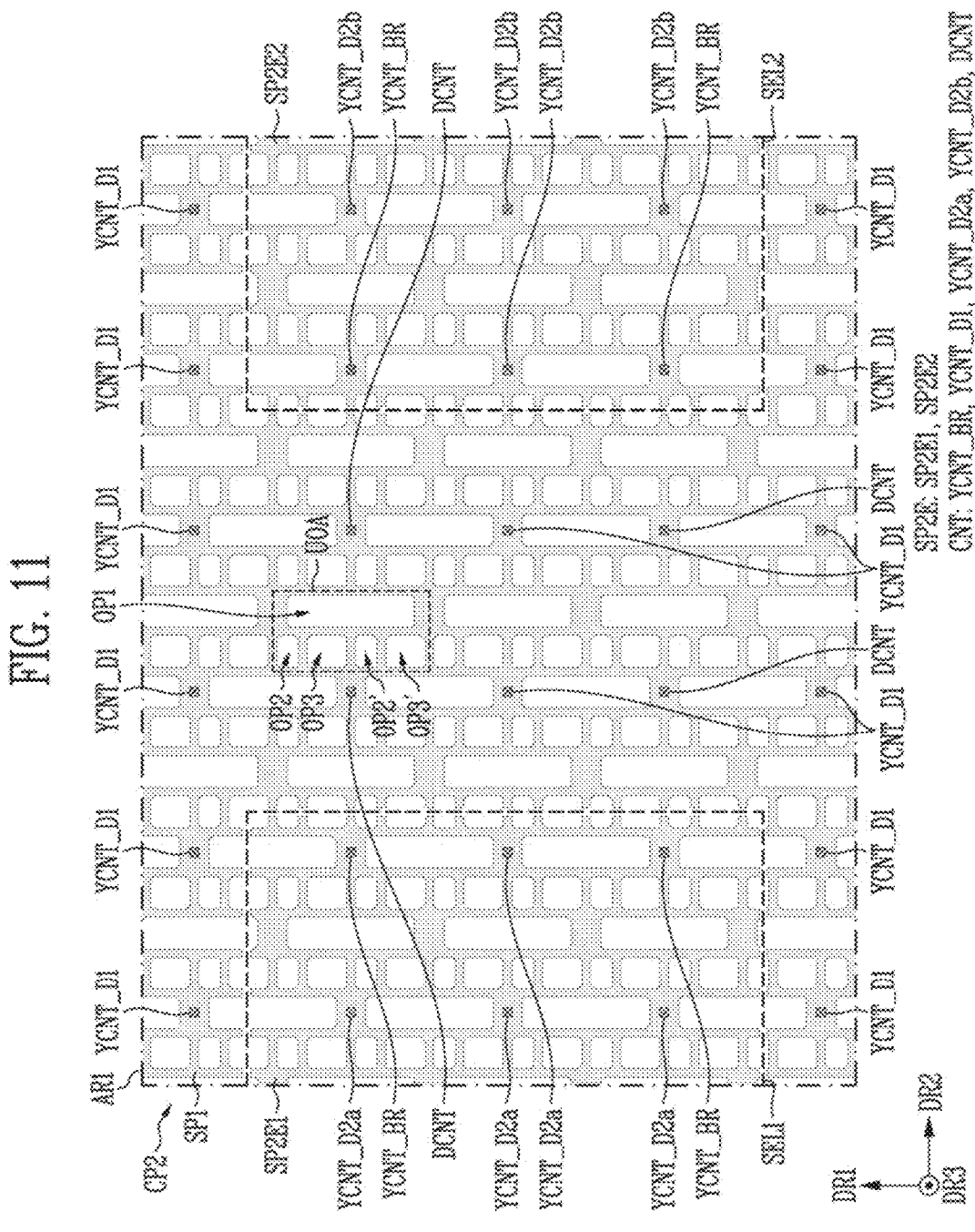

FIG. 9 is a plan view illustrating the display layer DP disposed in the area AR1, FIG. 10 is a plan view illustrating the first conductive pattern layer CP1 disposed in the area AR1, and FIG. 11 is a plan view illustrating the second conductive pattern layer CP2 disposed in the area AR1 and contact holes formed in the second insulating layer INS2 in the area AR1. FIG. 8 is a plan view illustrating the components illustrated in FIGS. 9 to 11 in an overlapping manner, and reference symbols are omitted for clarity.

Referring to FIG. 9, the display layer DP may include sub-pixels SPX (see FIG. 1) which are disposed in the area AR1. The respective sub-pixels SPX may be configured to be substantially the same as, or similar to, each other, as described above with reference to FIG. 3. In an embodiment, the sub-pixels SPX may be disposed in the area AR1 according to a predetermined rule to fill the area AR1 (or the display area DA) substantially without any gaps.

For example, a pixel unit area PXLU may be defined. In an embodiment, the pixel unit area PXLU may include a first pixel unit area PXLA and a second pixel unit area PXLA' which is adjacent to the first pixel unit area PXLA in a direction opposite to the first direction DR1.

In an embodiment, in the first pixel unit area PXLA, a first-first light emitting area EA1 of a first-first sub-pixel SPX1, a second-first light emitting area EA2 of a second-first sub-pixel SPX2 and a third-first light emitting area EA3 of a third-first sub-pixel SPX3 may be disposed. Each of the first-first light emitting area EA1, the second-first light emitting area EA2 and the third-first light emitting area EA3 may be configured to be substantially the same as, or similar to, the light emitting area EA described above with reference to FIG. 3.

In an embodiment, the first-first sub-pixel SPX1 may be a blue sub-pixel which emits light of a first color, such as blue. The first-first light emitting area EA1 may be an area where light of the first color emitted from the first-first sub-pixel SPX1 is visible. In an embodiment, the second-first sub-pixel SPX2 may be a red sub-pixel which emits light of a second color, such as red. The second-first light emitting area EA2 may be an area where light of the second color emitted from the second-first sub-pixel SPX2 is visible. In an embodiment, the third-first sub-pixel SPX3 may be a green sub-pixel which emits light of a third color, such as green. The third-first light emitting area EA3 may be an area where light of the third color emitted from the third-first sub-pixel SPX3 is visible.

In an embodiment, the area (e.g., in a plan view) of the first-first light emitting area EA1 may be larger than the area (e.g., in a plan view) of the second-first light emitting area EA2 and be larger than the area (e.g., in a plan view) of the third-first light emitting area EA3. In an embodiment, the area (e.g., in a plan view) of the second-first light emitting area EA2 may be less than the area (e.g., in a plan view) of the third-first light emitting area EA3. In this way, by differently forming the areas of the first-first light emitting area EA1, the second-first light emitting area EA2 and the third-first light emitting area EA3, it is possible to compensate for light emitting efficiency deviations by color of the first-first sub-pixel SPX1, the second-first sub-pixel SPX2 and the third-first sub-pixel SPX3.

In an embodiment, the first-first light emitting area EA1 may be separated from (e.g., spaced apart therefrom) the second-first and third-first light emitting areas EA2 and EA3 in the second direction DR2. The second-first light emitting area EA2 may be separated from (e.g., spaced apart therefrom) the third-first light emitting area EA3 in the first direction DR1.

In an embodiment, in the second pixel unit area PXLA', a first-second light emitting area EA1' of a first-second sub-pixel SPX1', a second-second light emitting area EA2' of a second-second sub-pixel SPX2' and a third-second light emitting area EA3' of a third-second sub-pixel SPX3' may be disposed. Each of the first-second light emitting area EA1', the second-second light emitting area EA2' and the third-second light emitting area EA3' may be configured to be substantially the same as, or similar to, the light emitting area EA described above with reference to FIG. 3.

In an embodiment, the first-second sub-pixel SPX1' may be a blue sub-pixel which emits light of the first color, such as blue. The first-second light emitting area EA1' may be an area where light of the first color emitted from the first-second sub-pixel SPX1' is visible. In an embodiment, the second-second sub-pixel SPX2' may be a red sub-pixel which emits light of the second color, such as red. The second-second light emitting area EA2' may be an area where light of the second color emitted from the second-second sub-pixel SPX2' is visible. The third-second sub-pixel SPX3' may be a green sub-pixel which emits light of the third color, such as green. The third-second light emitting area EA3' may be an area where light of the third color emitted from the third-second sub-pixel SPX3' is visible.

In an embodiment, the area (e.g., in a plan view) of the first-second light emitting area EA1' may be substantially the same as the area (e.g., in a plan view) of the first-first light emitting area EA1. The area (e.g., in a plan view) of the second-second light emitting area EA2' may be substantially the same as the area (e.g., in a plan view) of the second-first light emitting area EA2. The area (e.g., in a plan view) of the third-second light emitting area EA3' may be substantially the same as the area (e.g., in a plan view) of the third-first light emitting area EA3.

The first-second light emitting area EA1' may be separated from (e.g., spaced apart therefrom) the second-second and third-second light emitting areas EA2' and EA3' in the second direction DR2. The first-second light emitting area EA1' and the first-first light emitting area EA1 may be arranged in the first direction DR1.

The second-second light emitting area EA2' may be separated from (e.g., spaced apart therefrom) the third-second light emitting area EA3' in the first direction DR1. The third-second light emitting area EA3', the second-second light emitting area EA2', the third-first light emitting area EA3 and the second-first light emitting area EA2 may be arranged in the first direction DR1.

In an embodiment, each of the light emitting areas EA1, EA2, EA3, EA1', EA2' and EA3' may have a rectangular shape with rounded corners (e.g., in a plan view). However, embodiments of the present disclosure are not necessarily limited thereto.

A plurality of pixel unit areas PXLU in each of which the light emitting areas EA1, EA2, EA3, EA1', EA2' and EA3' are disposed may be provided. In an embodiment, these pixel unit areas PXLU may be arranged in the area AR1 (or the display area DA) according to a predetermined rule to fill the area AR1 (or the display area DA) substantially without any gaps.

Referring to FIG. 11, the second conductive pattern layer CP2 may be implemented as a mesh pattern. In an embodiment, the mesh pattern may include mesh openings which are arranged according to a predetermined rule.

For example, a unit opening area UOA may be defined. In an embodiment, the second conductive pattern layer CP2 which is implemented as the mesh pattern may include a first mesh opening OP1, a second-first mesh opening OP2, a third-first mesh opening OP3, a second-second mesh opening OP2' and a third-second mesh opening OP3' which are located in the unit opening area UOA.

In an embodiment, the unit opening area UOA may substantially completely overlap the pixel unit area PXLU described above with reference to FIG. 9 (e.g., in the third direction DR3). In this embodiment, as illustrated in FIG. 8, the first-first light emitting area EA1 and the first-second light emitting area EA1' may be exposed by the first mesh opening OP1, the second-first light emitting area EA2 may be exposed by the second-first mesh opening OP2, the third-first light emitting area EA3 may be exposed by the third-first mesh opening OP3, the second-second light emitting area EA2' may be exposed by the second-second mesh opening OP2', and the third-second light emitting area EA3' may be exposed by the third-second mesh opening OP3'. Accordingly, light emitted from the light emitting areas EA1, EA2, EA3, EA1', EA2' and EA3' may not be substantially blocked by the second conductive pattern layer CP2.

A plurality of unit opening areas UOA may be provided. In an embodiment, these unit opening areas UOA may be arranged in the area AR1 (or the sensing area SA) according to a predetermined rule to overlap corresponding pixel unit areas PXLU so as to fill the area AR1 (or the sensing area SA) substantially without any gaps.

In an embodiment, the second conductive pattern layer CP2 may include a first sensing electrode array SP1, a second-first sensing electrode SP2E1 and a second-second sensing electrode SP2E2.

The first sensing electrode array SP1 illustrated in FIG. 11 may be understood as illustrating one bridge portion BR_SP1 included in the first sensing electrode array SP1 described above with reference to FIG. 6 and portions of two first sensing electrodes SPIE connected by the bridge portion BR_SP1. The second-first sensing electrode SP2E1 and the second-second sensing electrode SP2E2 illustrated in FIG. 11 may be understood as illustrating portions of two adjacent second sensing electrodes SP2E included in the second sensing electrode array SP2 described above with reference to FIG. 7.

As a part of the mesh pattern is cut, the first sensing electrode array SP1, the second-first sensing electrode SP2E1 and the second-second sensing electrode SP2E2 may be implemented. For example, the first sensing electrode array SP1, the second-first sensing electrode SP2E1 and the second-second sensing electrode SP2E2 may be provided as components which are separated from each other.

For example, in an embodiment a first cut line SEL1 may be defined between the first sensing electrode array SP1 and the second-first sensing electrode SP2E1. In an embodiment, the second conductive pattern layer CP2 which is implemented as the mesh pattern may be cut along the first cut line SEL1. In this embodiment, some among the mesh openings may communicate with each other along the first cut line SEL1.

For example, in an embodiment a second cut line SEL2 may be defined between the first sensing electrode array SP1 and the second-second sensing electrode SP2E2. In an embodiment, the second conductive pattern layer CP2 which is implemented as the mesh pattern may be cut along the second cut line SEL2. In this embodiment, some other mesh openings among the mesh openings may communicate with each other along the second cut line SEL2.

Referring to FIG. 10, in an embodiment the first conductive pattern layer CP1 may include a bridge wiring BR_SP2 and a compensation bridge wiring DBR.

The bridge wiring BR_SP2 may be understood as the bridge wiring BR_SP2 described above with reference to FIG. 7.

In an embodiment, the compensation bridge wiring DBR may include a first compensation bridge wiring DBR_SP1, a second-first compensation bridge wiring DBR_SP2E1, and a second-second compensation bridge wiring DBR_SP2E2. The compensation bridge wiring DBR may serve to reduce the visibility of first reflected light reflected by the bridge wiring BR_SP2. For example, in a comparative embodiment in which the compensation bridge wiring DBR does not exist, first reflected light reflected by the bridge wiring BR_SP2 may be prominently visible as a bright spot to a user of the display device DD. However, in an embodiment in which the compensation bridge wiring DBR is additionally provided, second reflected light reflected by the compensation bridge wiring DBR may be visible together with the first reflected light to the user of the display device DD. In this embodiment, since the second reflected light forms a reflected light pattern together with the first reflected light according to a predetermined rule, the first reflected light may not be visible as a prominent bright spot. Therefore, it is possible to prevent the visibility of the display device DD from deteriorating.

In an embodiment, the bridge wiring BR_SP2 and the compensation bridge wiring DBR may be separated from each other (e.g., spaced apart from each other). In this embodiment, the first compensation bridge wiring DBR_SP1, the second-first compensation bridge wiring DBR_SP2E1 and the second-second compensation bridge wiring DBR_SP2E2 may also be separated from each other (e.g., spaced apart from each other).

In an embodiment, each of the bridge wiring BR_SP2, the first compensation bridge wiring DBR_SP1, the second-first compensation bridge wiring DBR_SP2E1 and the second-second compensation bridge wiring DBR_SP2E2 may extend longitudinally in the second direction DR2.

In an embodiment, the length of the bridge wiring BR_SP2 in the second direction DR2 may be greater than each of the length of the first compensation bridge wiring DBR_SP1 in the second direction DR2, the length of the second-first compensation bridge wiring DBR_SP2E1 in the second direction DR2 and the length of the second-second compensation bridge wiring DBR_SP2E2 in the second direction DR2.

In an embodiment, the length of the first compensation bridge wiring DBR_SP1 in the second direction DR2, the length of the second-first compensation bridge wiring DBR_SP2E1 in the second direction DR2 and the length of the second-second compensation bridge wiring DBR_SP2E2 in the second direction DR2 may be substantially the same as each other.

In an embodiment, the bridge wiring BR_SP2 may include a bridge opening BR_OPN. Due to the bridge opening BR_OPN, the first insulating layer INS1 which is disposed under the first conductive pattern layer CP1 may be exposed. In an embodiment, the bridge opening BR_OPN may have various shapes when viewed on a plan view. For example, as illustrated in FIG. 10, the bridge opening BR_OPN may have a hexagonal shape. However, the planar shape of the bridge opening BR_OPN is not necessarily limited thereto.

In an embodiment, one bridge wiring BR_SP2 may include at least two bridge openings BR_OPN. For example, as illustrated in FIG. 10, in an embodiment one bridge wiring BR_SP2 may include two bridge openings BR_OPN. However, embodiments of the present disclosure are not necessarily limited thereto and the bridge wiring BR_SP2 may include three or more bridge openings BR_OPN in some embodiments.

Referring to FIGS. 8 to 14, the first conductive pattern layer CP1 and the second conductive pattern layer CP2 may be connected (e.g., directly connected) to each other through contact holes which are formed in the second insulating layer INS2. The planar disposition of contact holes CNT is illustrated in FIG. 11.

In an embodiment, the contact holes CNT may include bridge contact holes YCNT_BR, first compensation contact holes YCNT_D1, second-first compensation contact holes YCNT_D2a, second-second compensation contact holes YCNT_D2b, and dummy contact holes DCNT.

In an embodiment, the bridge wiring BR_SP2 may be connected to (e.g., directly connected thereto) the second-first sensing electrode SP2E1 and the second-second sensing electrode SP2E2 through the bridge contact holes YCNT_BR. Accordingly, the bridge contact holes YCNT_BR for electrical connection between the second-first sensing electrode SP2E1 and the second-second sensing electrode SP2E2 may be provided.

In an embodiment, the first compensation bridge wiring DPR_SP1 may be connected to (e.g., directly connected thereto) the first sensing electrode array SP1 through the first compensation contact holes YCNT_D1. The second-first compensation bridge wiring DBR_SP2E1 may be connected to (e.g., directly connected thereto) the second-first sensing electrode SP2E1 through the second-first compensation contact holes YCNT_D2a. The second-second compensation bridge wiring DBR_SP2E2 may be connected to (e.g., directly connected thereto) the second-second sensing electrode SP2E2 through the second-second compensation contact holes YCNT_D2b.

The first sensing electrode array SP1 may directly contact, through the dummy contact hole DCNT, the first insulating layer INS1 which is exposed by the bridge opening BR_OPN. In this embodiment, when viewed on a plan view, the bridge opening BR_OPN may be separated from the dummy contact hole DCNT while surrounding the dummy contact hole DCNT. Accordingly, a portion of the first sensing electrode array SP1 which is disposed in the dummy contact hole DCNT may be separated from the bridge wiring BR_SP2. Therefore, a short circuit may not occur between the first sensing electrode array SP1 and the bridge wiring BR_SP2. For example, insulation may be secured between the first sensing electrode array SP1 and the second sensing electrode array SP2 (see FIG. 5).

The dummy contact hole DCNT, the first compensation contact hole YCNT_D1, the second-first compensation contact hole YCNT_D2a and the second-second compensation contact hole YCNT_D2b may serve to reduce the visibility of third reflected light reflected by the bridge contact hole YCNT_BR. For example, in a comparative embodiment in which the dummy contact hole DCNT, the first compensation contact hole YCNT_D1, the second-first compensation contact hole YCNT_D2a and the second-second compensation contact hole YCNT_D2b do not exist, third reflected light reflected by the bridge contact hole YCNT_BR may be prominently visible as a bright spot to the user of the display device DD. However, in an embodiment in which the dummy contact hole DCNT, the first compensation contact hole YCNT_D1, the second-first compensation contact hole YCNT_D2a and the second-second compensation contact hole YCNT_D2b are additionally provided, fourth reflected light reflected by the dummy contact hole DCNT, the first compensation contact hole YCNT_D1, the second-first compensation contact hole YCNT_D2a and the second-second compensation contact hole YCNT_D2b may be visible together with the third reflected light to the user of the display device DD. In this embodiment, since the fourth reflected light forms a reflected light pattern together with the third reflected light according to a predetermined rule, the third reflected light may not be visible as a prominent bright spot. Therefore, it is possible to prevent the visibility of the display device DD from deteriorating.

In an embodiment, each of the bridge wiring BR_SP2, the first compensation bridge wiring DBR_SP1, the second-first compensation bridge wiring DBR_SP2E1 and the second-second compensation bridge wiring DBR_SP2E2 may be provided in a plural number. For example, in an embodiment as illustrated in FIG. 10, two bridge wirings BR_SP2 may be disposed between an area surrounded by the first cut line SEL1 and an area surrounded by the second cut line SEL2 in a plan view.

In an embodiment, each of the bridge contact hole YCNT_BR, the first compensation contact hole YCNT_D1, the second-first compensation contact hole YCNT_D2a and the second-second compensation contact hole YCNT_D2b may be provided in a plural number. For example, as illustrated in FIG. 8, in an embodiment two bridge contact holes YCNT_BR may be provided for each of the bridge wirings BR_SP2. For example, as illustrated in FIG. 8, two first compensation contact holes YCNT_D1 may be provided for each of the first compensation bridge wirings DBR_SP1. For example, as illustrated in FIG. 8, two second-first compensation contact holes YCNT_D2a may be provided for each of the second-first compensation bridge wirings DBR_SP2E1. For example, as illustrated in FIG. 8, two second-second compensation contact holes YCNT_D2b may be provided for each of the second-second compensation bridge wirings DBR_SP2E2.

In an embodiment, the dummy contact hole DCNT may be provided in a plural number. For example, as illustrated in FIG. 8, in an embodiment dummy contact holes DCNT may be provided in one-to-one correspondence to the bridge openings BR_OPN.

In an embodiment, each of the contact holes CNT may be located in an intervening area between two first mesh openings OP1 included in two unit opening areas UOA which are adjacent to each other in the first direction DR1. For example, in an embodiment one dummy contact hole DCNT may be located in an intervening area between two first mesh openings OP1 included in two unit opening areas UOA which are adjacent in the first direction DR1. In this embodiment, as illustrated in FIGS. 8 and 11, regularity may be imparted to the planar arrangement of the contact holes CNT.

In an embodiment, when dividing the area AR1 illustrated in FIG. 8 into unit areas which have the same area and the same shape as each other (e.g., in a plan view), the number of contact holes CNT existing in any one unit area may be the same as the number of contact holes CNT existing in another unit area. In this embodiment, the separation distance in the second direction DR2 between two contact holes CNT adjacent in the second direction DR2 may be constant, and the separation distance in the first direction DR1 between two contact holes CNT adjacent in the first direction DR1 may be constant. In this way, as the contact holes CNT are arranged with regularity, a reflected pattern visible by reflected light reflected by the contact holes CNT may have regularity. Therefore, the visibility of such a reflected pattern may be substantially lowered.

Accordingly, in an embodiment of the present disclosure, by imparting regularity to the arrangement of the contact holes CNT, the visibility of a reflected pattern appearing by reflected light reflected by the contact holes CNT may be substantially lowered. For example, in an embodiment of the present disclosure, while imparting the aforementioned regularity to the contact holes CNT, to secure insulation between the bridge wiring BR_SP2 and the first sensing electrode array SP1, the structure is included in which the bridge wiring BR_SP2 includes the bridge opening BR_OPN and the first sensing electrode array SP1 directly contacts the first insulating layer INS1 exposed by the bridge opening BR_OPN through the dummy contact hole DCNT.

FIGS. 15 to 18 are plan views illustrating a display device according to embodiments of the present disclosure. FIG. 19 is a cross-sectional view taken along the line J1-J1' of FIG. 15.

In describing FIGS. 15 to 19, differences compared to embodiments described above with reference to FIGS. 8 to 14 will be mainly described, and a duplicative description of identical or similar elements may be omitted for economy of explanation.

Referring to FIGS. 15 to 19, the first conductive pattern layer CP1 may further include an additional compensation bridge wiring ADBR. In an embodiment, the additional compensation bridge wiring ADBR may include a first additional compensation bridge wiring ADBR_SP1, a second-first additional compensation bridge wiring ADBR_SP2E1 and a second-second additional compensation bridge wiring ADBR_SP2E2. The additional compensation bridge wiring ADBR may be separated from (e.g., spaced apart from) the compensation bridge wiring DBR.

In addition, in the second insulating layer INS2, a first additional compensation contact hole AYCNT_D1 for connecting the first additional compensation bridge wiring ADBR_SP1 and the first sensing electrode array SP1 to each other, a second-first additional compensation contact hole AYCNT_D2a for connecting the second-first additional compensation bridge wiring ADBR_SP2E1 and the second-first sensing electrode SP2E1 to each other and a second-second additional compensation contact hole AYCNT_D2b for connecting the second-second additional compensation bridge wiring ADBR_SP2E2 and the second-second sensing electrode SP2E2 to each other may be additionally formed. For example, the contact holes CNT may further include the first additional compensation contact hole AYCNT_D1, the second-first additional compensation contact hole AYCNT_D2a and the second-second additional compensation contact hole AYCNT_D2b.

In an embodiment, each of the first additional compensation bridge wiring ADBR_SP1, the second-first additional compensation bridge wiring ADBR_SP2E1 and the second-second additional compensation bridge wiring ADBR_SP2E2 may be provided in a plural number.

In an embodiment, each of the first additional compensation contact hole AYCNT_D1, the second-first additional compensation contact hole AYCNT_D2a and the second-second additional compensation contact hole AYCNT_D2b may be provided in a plural number.

Figure 15:
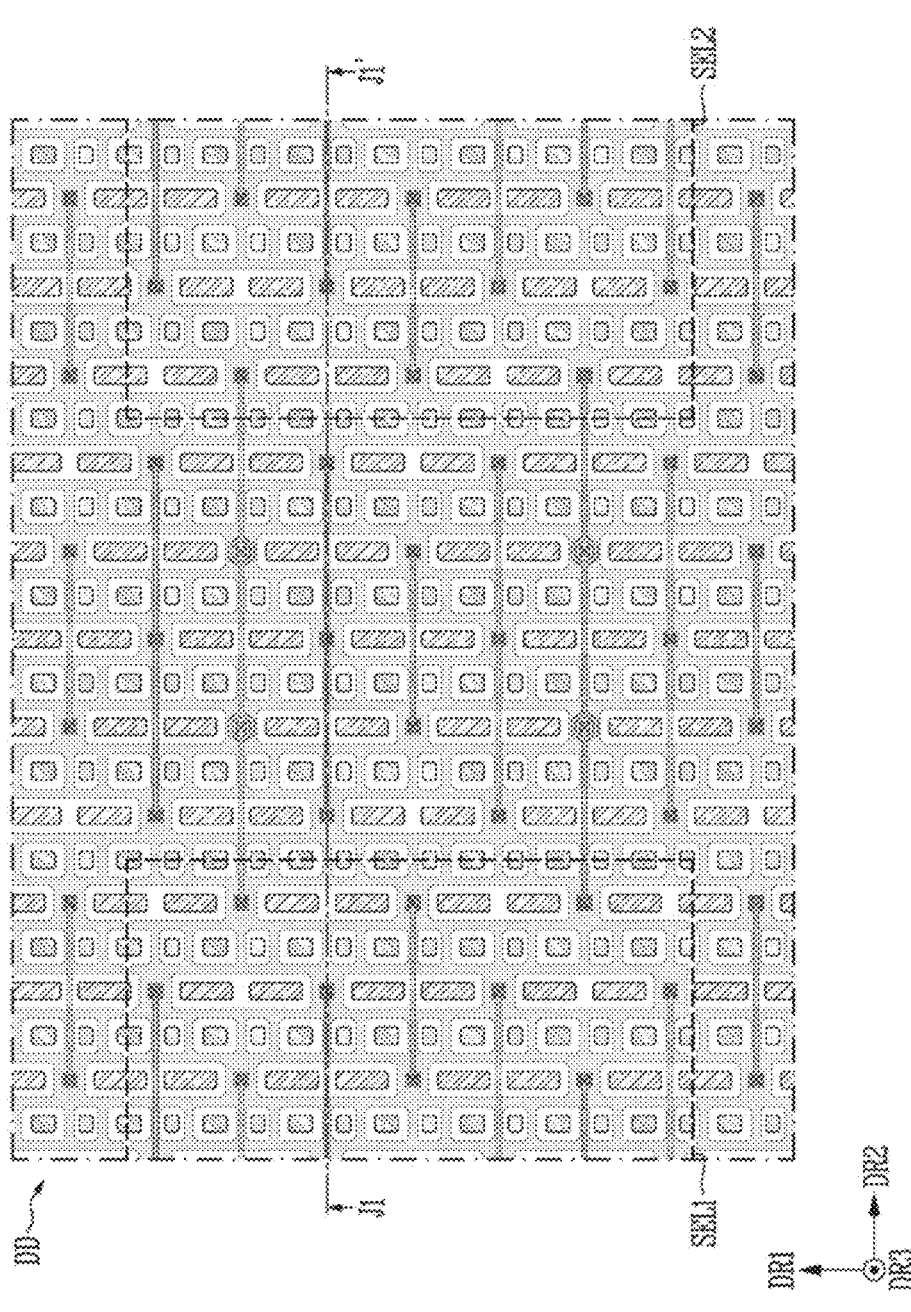
FIGS. 15 to 18 are plan views illustrating a display device according embodiments of the present disclosure.
Figure 16:
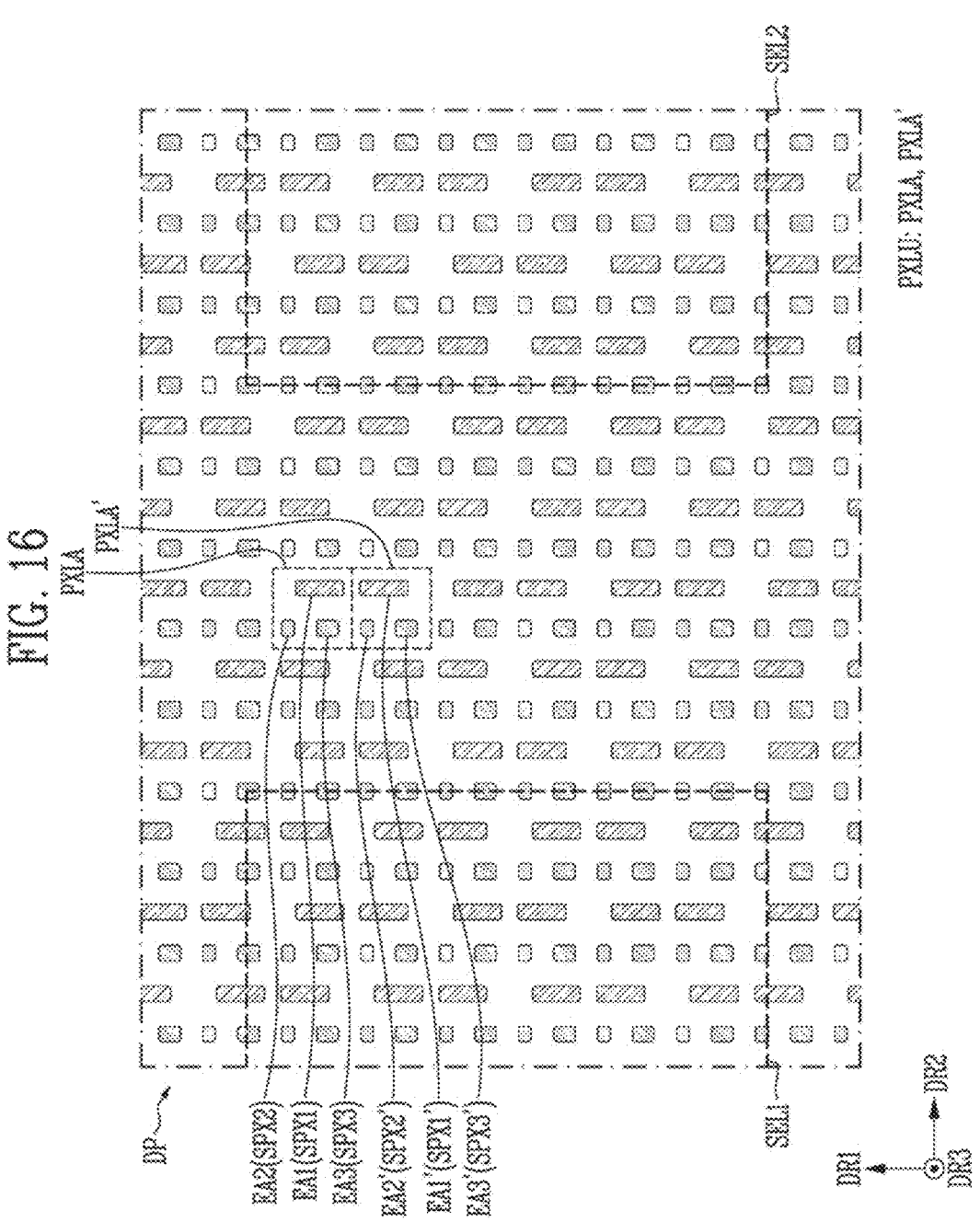
Figure 17:
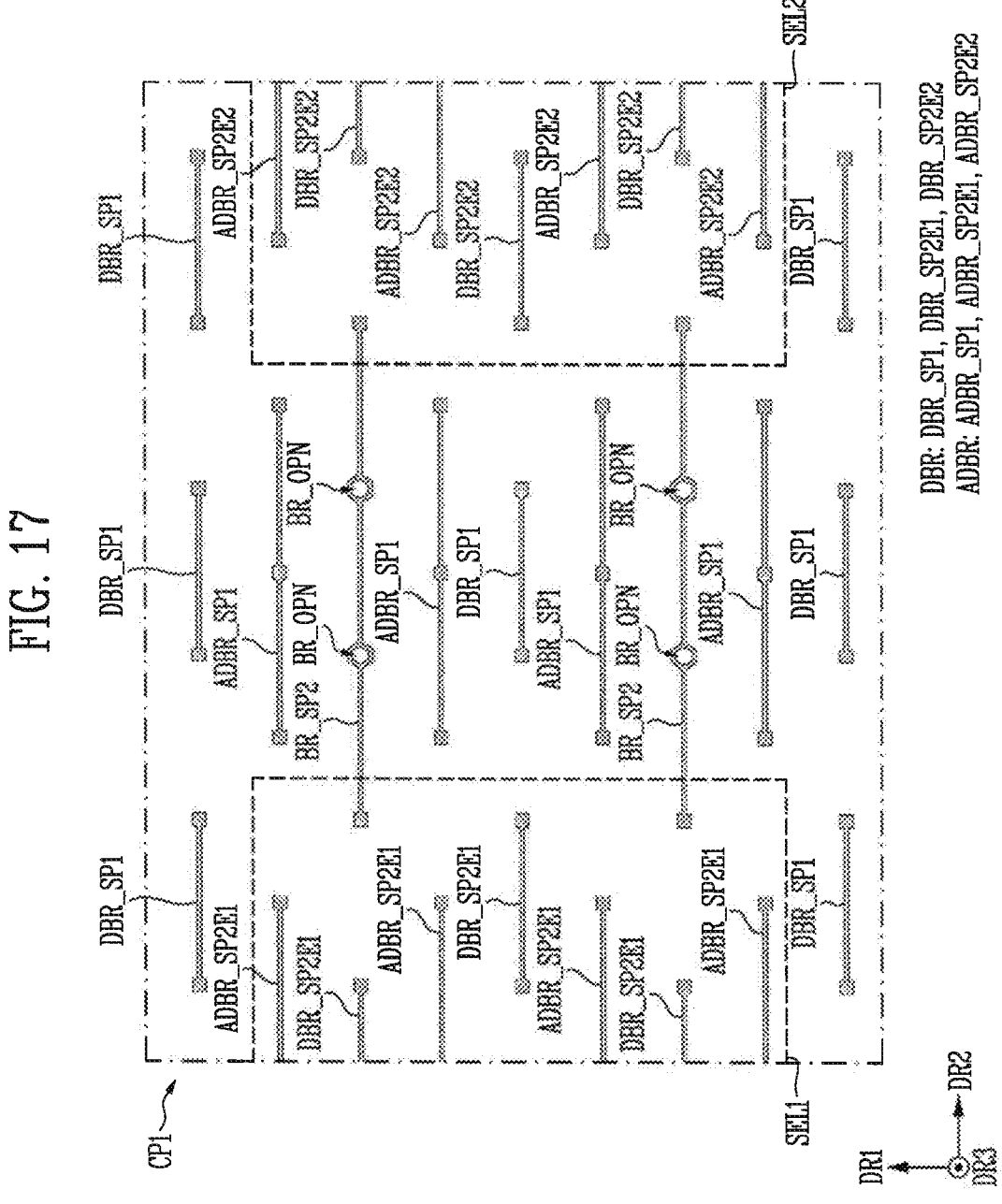
Figure 18:
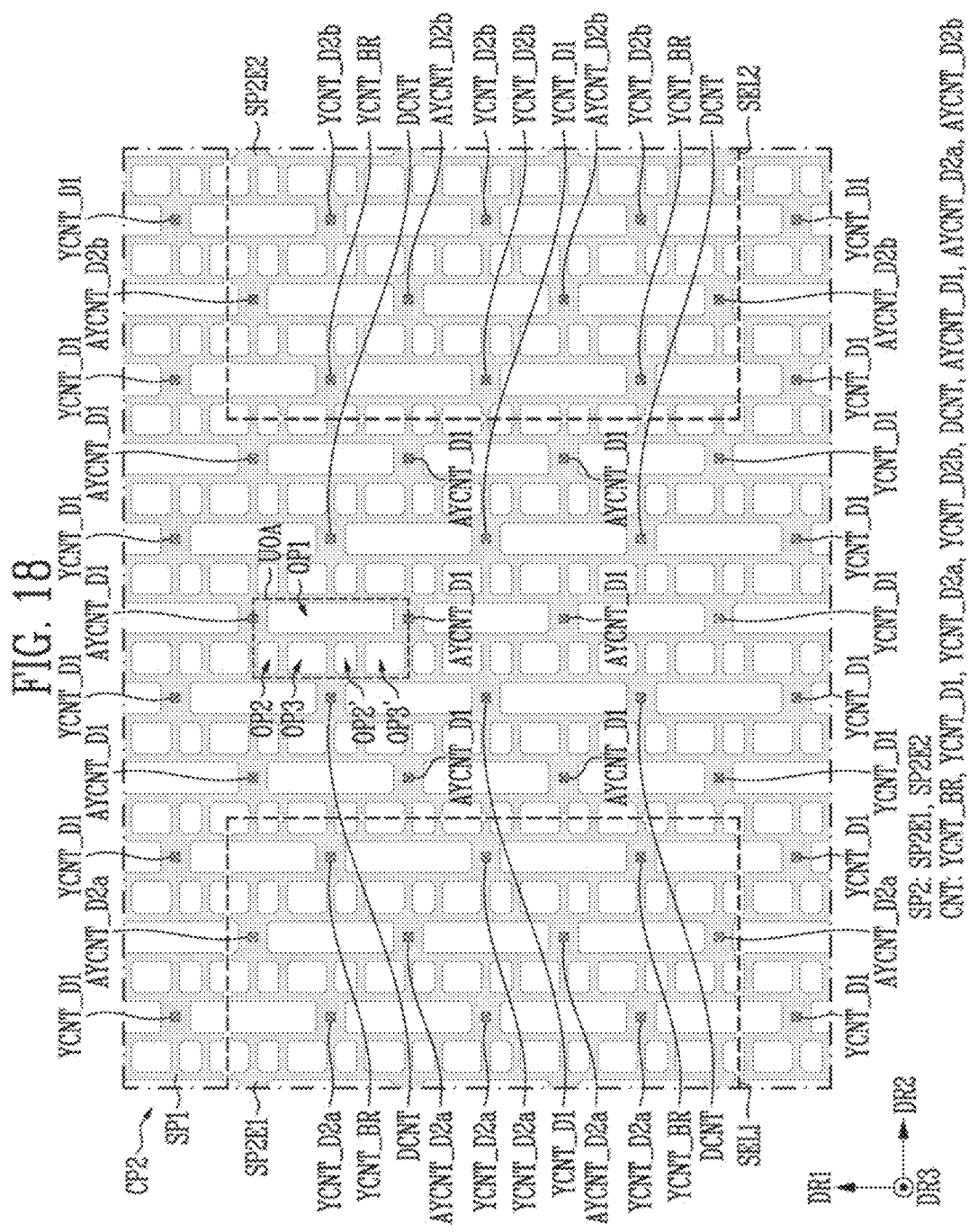
Figure 19:
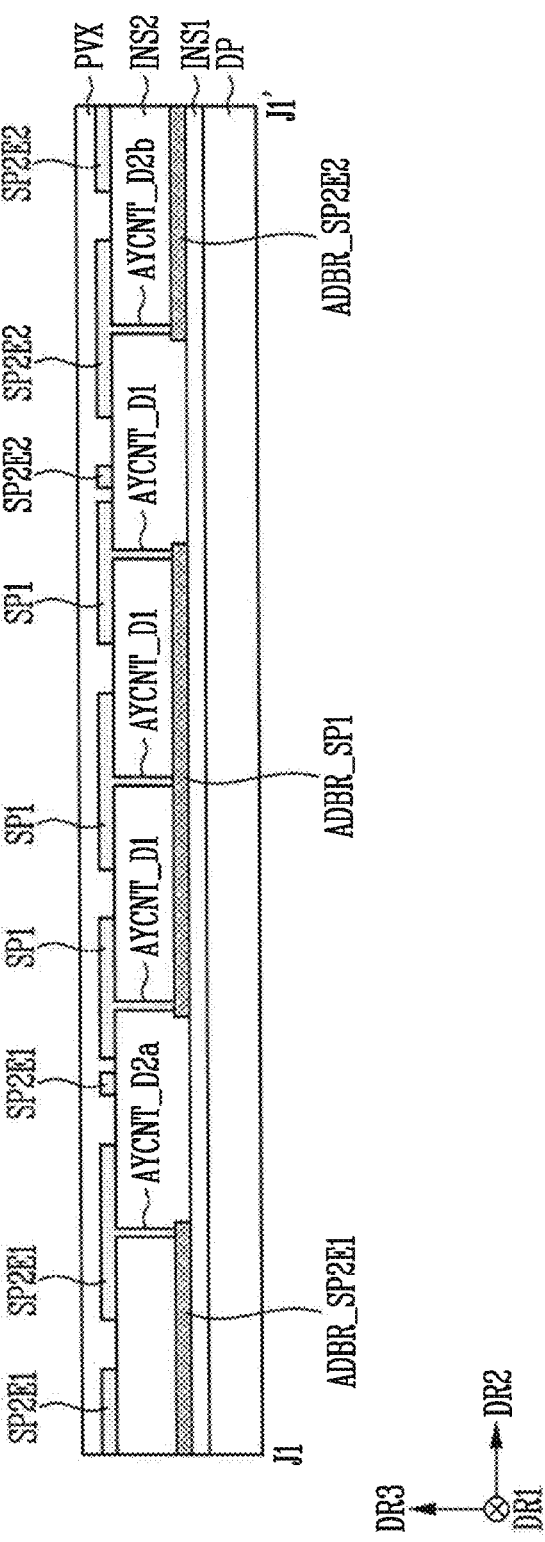
FIG. 19 is a cross-sectional view taken along the line J1-J1' of FIG. 15 according to an embodiment of the present disclosure.
Figure 21:
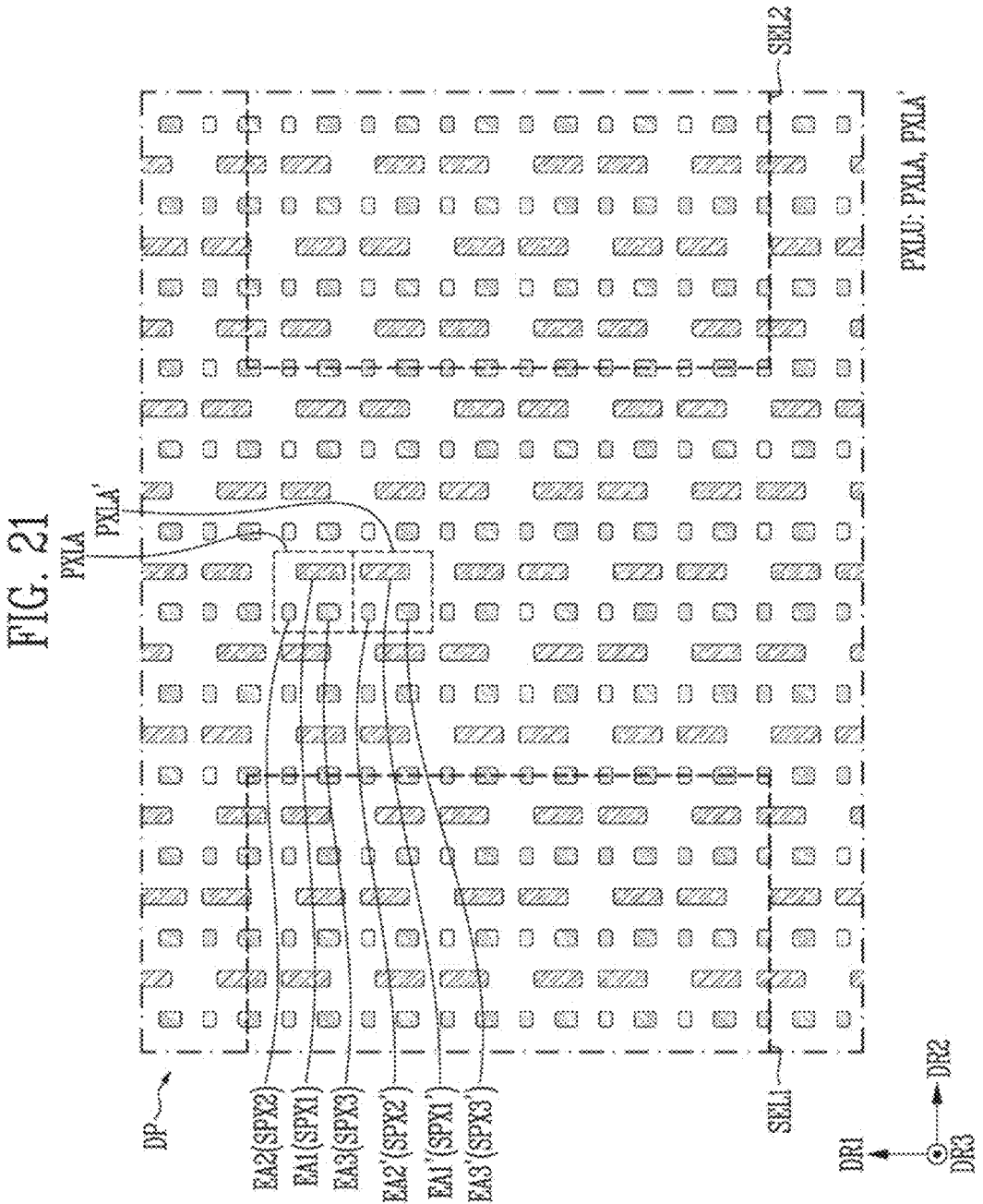
Figure 22:
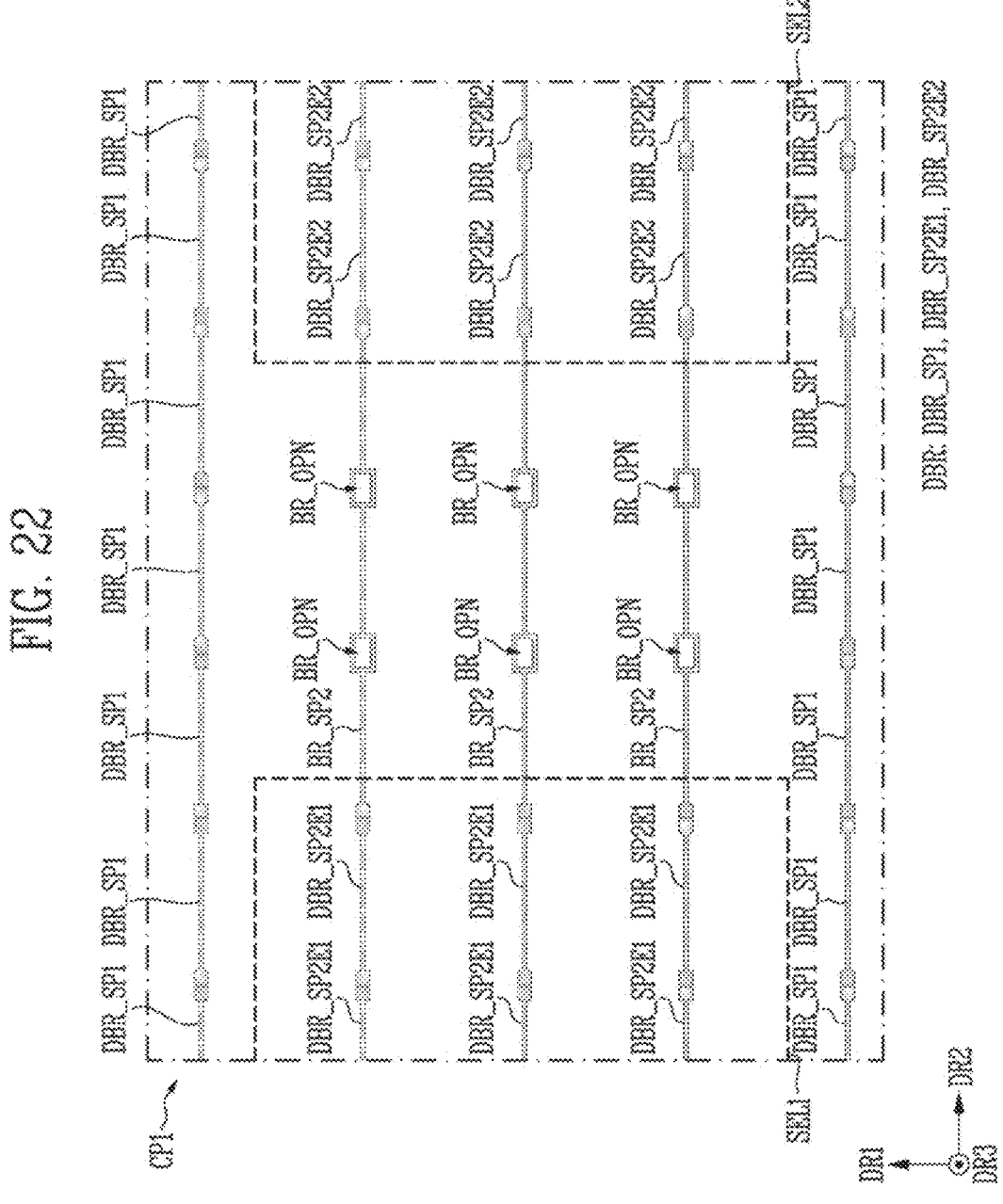

Compared to embodiment described above with reference to FIGS. 8 to 14, embodiments illustrated in FIGS. 15 to 19 may have a greater number of contact holes CNT per unit area. Even in this embodiment, as illustrated in FIGS. 15 and 18, regularity may be imparted to the arrangement of the contact holes CNT. For example, each of the contact holes CNT may be located in an intervening area between two first mesh openings OP1 included in two unit opening areas UOA which are adjacent in the first direction DR1. For example, in an embodiment, when dividing the area AR1 illustrated in FIG. 15 into unit areas which have the same area and the same shape, the number of contact holes CNT existing in any one unit area may be the same as the number of contact holes CNT existing in another unit area. In this embodiment, the separation distance in the second direction DR2 between two contact holes CNT adjacent in the second direction DR2 may be constant, and the separation distance in the first direction DR1 between two contact holes CNT adjacent in the first direction DR1 may be constant.

Accordingly, since the contact holes CNT are arranged with regularity, a reflected pattern visible by reflected light reflected by the contact holes CNT may have regularity. Therefore, the visibility of such a reflected pattern may be substantially lowered.

Figure 24:
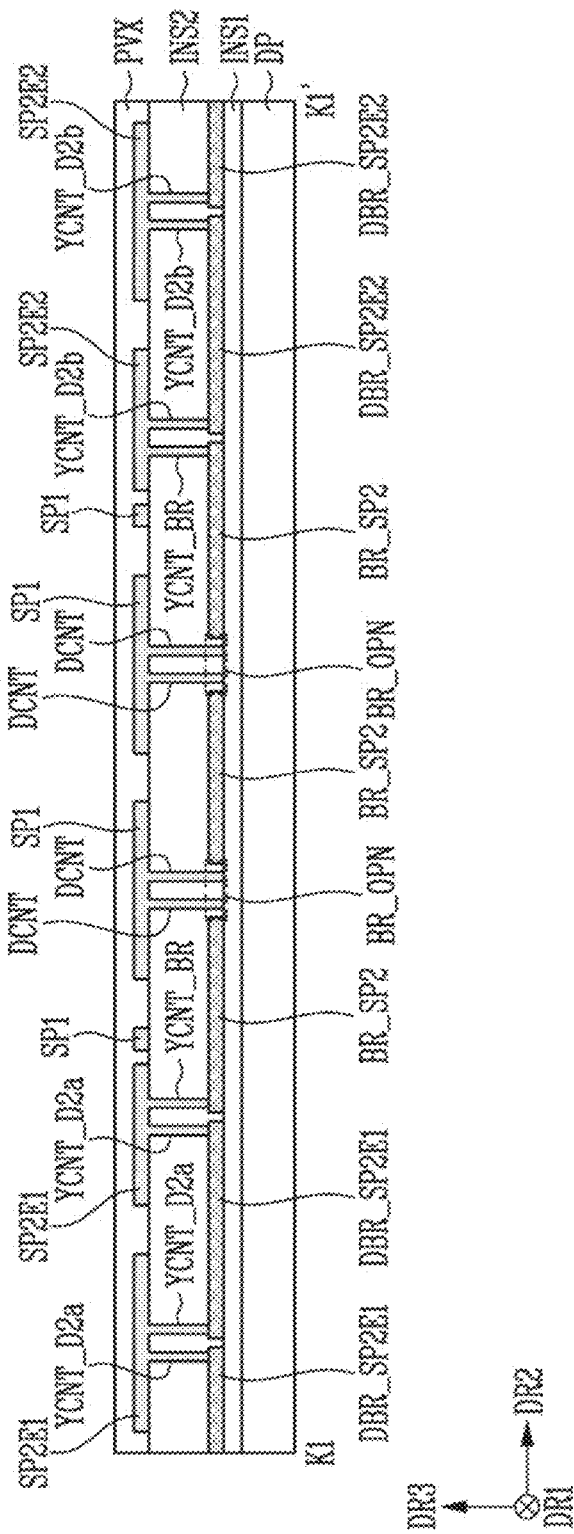
FIG. 24 is a cross-sectional view taken along the line K1-K1' of FIG. 20 according to an embodiment of the present disclosure.
Figure 25:
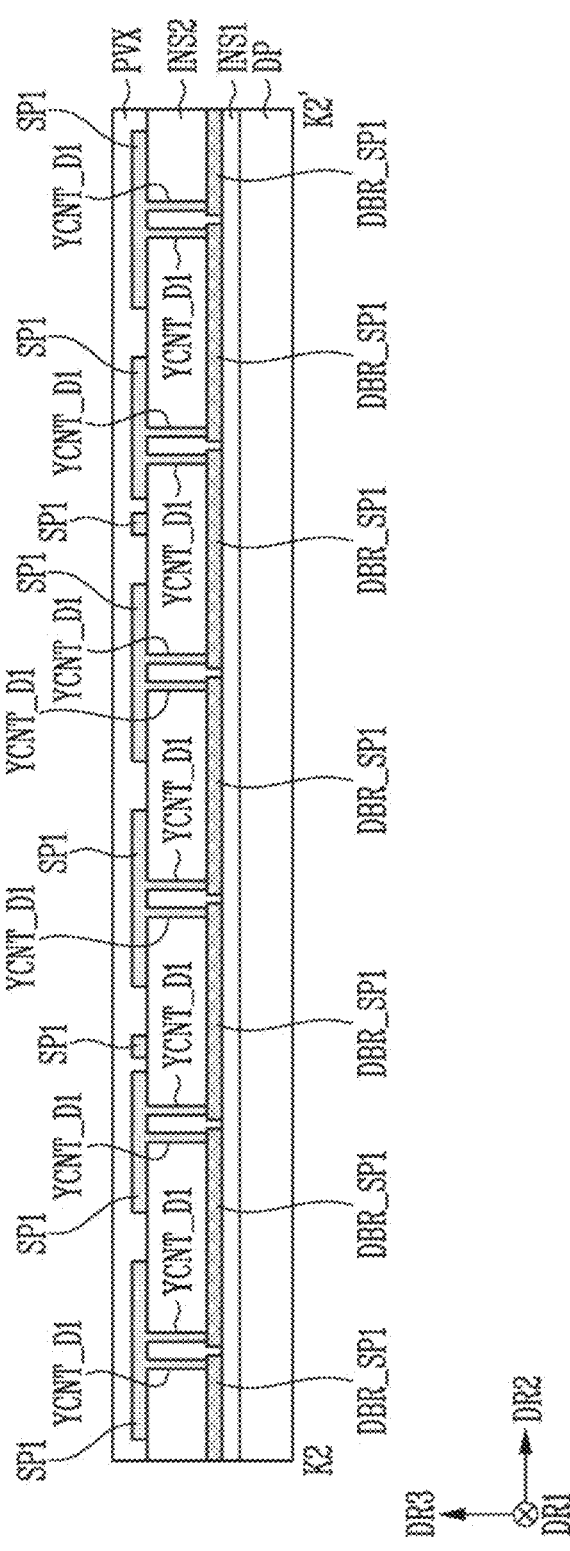
FIG. 25 is a cross-sectional view taken along the line K2-K2' of FIG. 20 according to an embodiment of the present disclosure.

FIGS. 20 to 23 are plan views illustrating a display device according to embodiments of the present disclosure. FIG. 24 is a cross-sectional view taken along the line K1-K1' of FIG. 20. FIG. 25 is a cross-sectional view taken along the line K2-K2' of FIG. 20.

In describing FIGS. 20 to 25, differences compared to embodiments described above with reference to FIGS. 8 to 14 will be mainly described, and a duplicative description of similar or identical elements may be omitted for economy of description.

Referring to FIGS. 20 to 25, two contact holes CNT may be located in an intervening area between two first mesh openings OP1 included in two unit opening areas UOA which are adjacent to each other in the first direction DR1.

For example, in an embodiment the intervening area may include a first intervening area IA1 in which two dummy contact holes DCNT are located, a second intervening area IA2 in which two first compensation contact holes YCNT_D1 are located, a third intervening area IA3 in which two second-first compensation contact holes YCNT_D2a are located, a fourth intervening area IA4 in which two second-second compensation contact holes YCNT_D2b are located, a fifth intervening area IA5 in which one second-first compensation contact hole YCNT_D2a and one bridge contact hole YCNT_BR are located, and a sixth intervening area IA6 in which one second-second compensation contact hole YCNT_D2b and one bridge contact hole YCNT_BR are located.

In this embodiment, one bridge opening BR_OPN may be configured to surround two dummy contact holes DCNT. However, embodiments of the present disclosure are not necessarily limited thereto. For example, in some embodiments one bridge opening BR_OPN may be configured to surround three or more dummy contact holes DCNT.

Compared to embodiments described above with reference to FIGS. 8 to 14, embodiments illustrated in FIGS. 20 to 25 may have a greater number of contact holes CNT per unit area. Even in this embodiment, as illustrated in FIGS. 20 and 23, regularity may be imparted to the arrangement of contact holes CNT.

Accordingly, since the contact holes CNT are arranged with regularity, a reflected pattern visible by reflected light reflected by the contact holes CNT may have regularity. Therefore, the visibility of such a reflected pattern may be substantially lowered.

Figure 26:
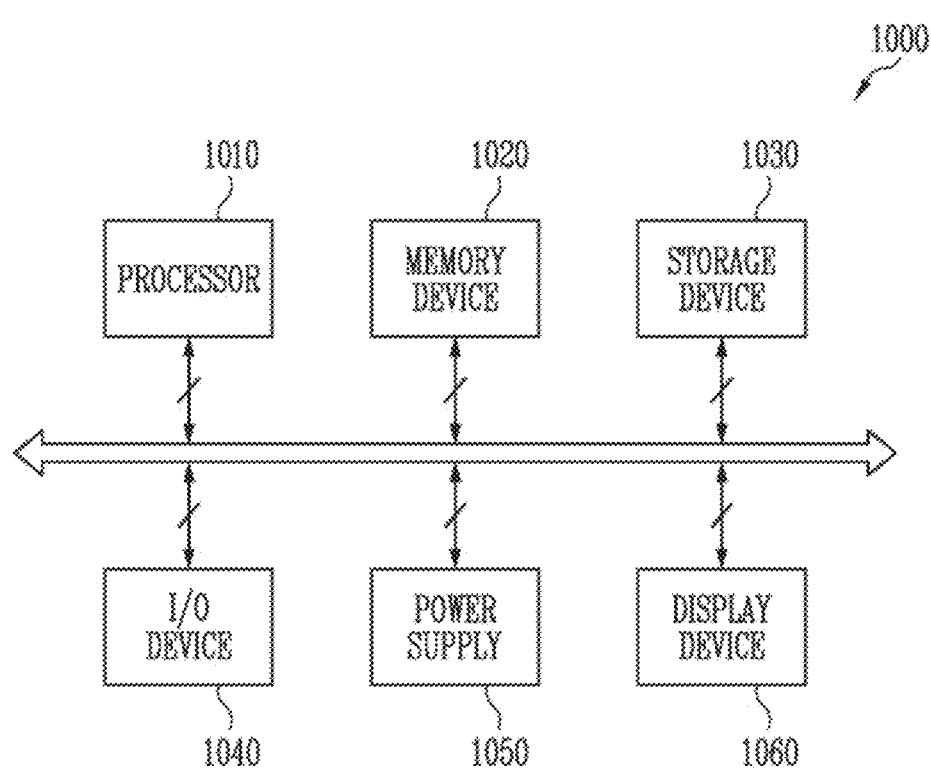
FIG. 26 is a diagram illustrating an electronic device including a display device according to an embodiment of the present disclosure.
Figure 27:
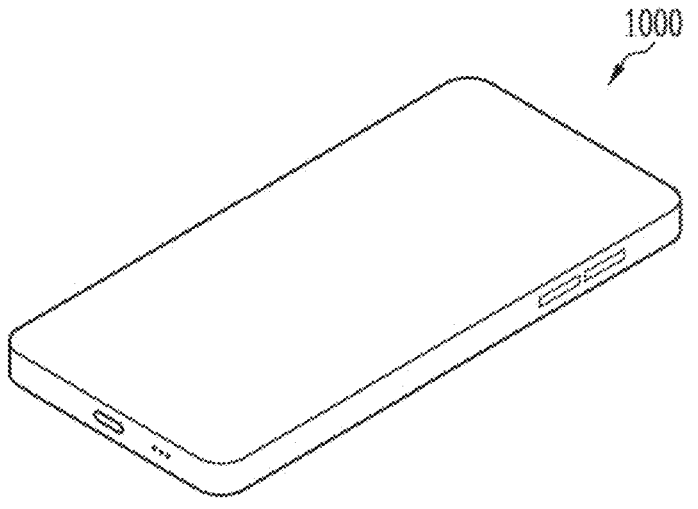
FIG. 27 is a diagram showing an example in which the electronic device of FIG. 26 is implemented as a smartphone according to an embodiment of the present disclosure.
Figure 28:
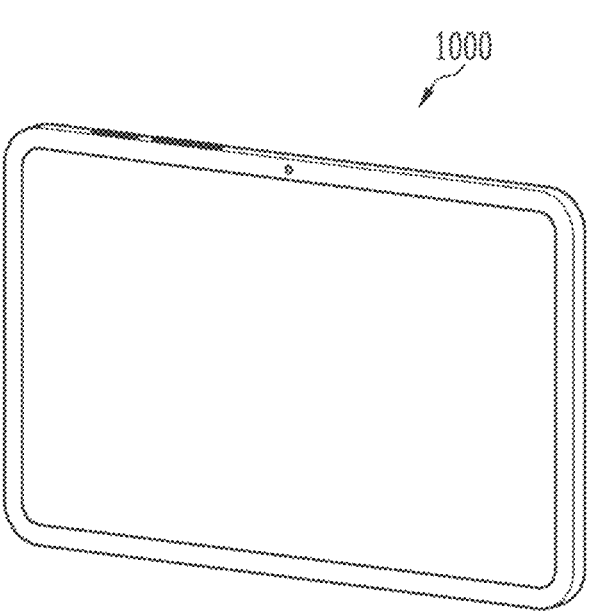
FIG. 28 is a diagram showing an example in which the electronic device of FIG. 26 is implemented as a tablet PC according to an embodiment of the present disclosure.

FIG. 26 is a diagram illustrating an electronic device including a display device according to an embodiment of the present disclosure. FIG. 27 is a diagram showing an embodiment in which the electronic device of FIG. 26 is implemented as a smartphone. FIG. 28 is a diagram showing an embodiment in which the electronic device of FIG. 26 is implemented as a tablet PC.

Referring to FIGS. 26 to 28, in an embodiment the electronic device 1000 may include a processor 1010, a memory device 1020, a storage device 1030, an input/output (I/O) device 1040, a power supply 1050, and a display device 1060. The display device 1060 may be the display device DD described above with reference to FIG. 1. The electronic device 1000 may further include a plurality of ports capable of communicating with a video card, a sound card, a memory card, a USB device, etc. or communicating with other systems. In an embodiment, as illustrated in FIG. 27, the electronic device 1000 may be implemented as a smartphone. However, embodiments of the present disclosure are not necessarily limited thereto. For example, in an embodiment, as illustrated in FIG. 28, the electronic device 1000 may be implemented as a tablet PC. However, embodiments of the present disclosure are not necessarily limited thereto, and the electronic device 1000 may vary. For example, the electronic device 1000 may be implemented as a mobile phone, a video phone, a smart pad, a smart watch, a vehicle navigation system, a computer monitor, a notebook, a head-mounted display device, etc.

The processor 1010 may perform specific calculations or tasks. According to an embodiment, the processor 1010 may be a microprocessor, a central processing unit, an application processor, or the like. The processor 1010 may be connected to (e.g., electrically connected thereto) other components via an address bus, a control bus and a data bus. Depending on an embodiment, the processor 1010 may also be connected to an expansion bus such as a Peripheral Component Interconnect (PCI) bus. According to an embodiment, the processor 1010 may provide input image data to the display device 1060, and accordingly, the display device 1060 may display an image on the basis of the input image data provided from the processor 1010.

The memory device 1020 may store data necessary for an operation of the electronic device 1000. For example, in an embodiment the memory device 1020 may include a non-volatile memory device such as an Erasable Programmable Read-Only Memory (EPROM) device, an Electrically Erasable Programmable Read-Only Memory (EEPROM) device, a flash memory device, a Phase Change Random Access Memory (PRAM) device, a Resistive Random Access Memory (RRAM) device, a Nano Floating Gate Memory (NFGM) device, a Polymer Random Access Memory (PoRAM) device, a Magnetic Random Access Memory (MRAM) device or a Ferroelectric Random Access Memory (FRAM) device, and/or a volatile memory device such as a Dynamic Random Access Memory (DRAM) device, a Static Random Access Memory (SRAM) device or a mobile DRAM device.

In an embodiment, the storage device 1030 may include a Solid State Drive (SSD), a Hard Disk Drive (HDD), a CD-ROM, and the like.

In an embodiment, the input/output device 1040 may include input means such as a keyboard, a keypad, a touch pad, a touch screen or a mouse and output means such as a speaker or a printer. According to an embodiment, the input/output device 1040 may be implemented integrally with the display device 1060.

The power supply 1050 may supply power necessary for an operation of the electronic device 1000. For example, in an embodiment the power supply 1050 may be a power management integrated circuit (PMIC). According to an embodiment, the power supply 1050 may supply power to the display device 1060.

The display device 1060 may display an image corresponding to visual information of the electronic device 1000. The display device 1060 may be connected to other components via the buses or other communication links.

Although description has been made above with reference to non-limiting embodiments, those skilled in the art will understand that various modifications and changes may be made to embodiments of the present disclosure without departing from the spirit and scope of the present disclosure.

What is claimed is:

1. A display device comprising:
a display layer including pixels; and
an input sensing layer disposed on the display layer, the input sensing layer including a first conductive pattern layer, a second conductive pattern layer and a sensing insulating layer interposed between the first conductive pattern layer and the second conductive pattern layer,
wherein the second conductive pattern layer includes a first sensing electrode array extending in a first direction, and second-first and second-second sensing electrodes that are separated from each other in a second direction intersecting the first direction with the first sensing electrode array interposed therebetween,
wherein the first conductive pattern layer includes a bridge wiring connected to the second-first and second-second sensing electrodes through bridge contact holes defined in the sensing insulating layer, the bridge wiring is electrically insulated from and intersects the first sensing electrode array,
wherein the bridge wiring includes a bridge opening exposing an insulating layer disposed under the bridge wiring, and
wherein the first sensing electrode array directly contacts the insulating layer exposed by the bridge opening through a dummy contact hole defined in the sensing insulating layer.

2. The display device of claim 1, wherein the bridge opening surrounds the dummy contact hole in a plan view.

3. The display device of claim 2, wherein:
the bridge opening includes a plurality of bridge openings and the dummy contact hole includes a plurality of dummy contact holes; and
one bridge opening surrounds two dummy contact holes in a plan view.

4. The display device of claim 1, wherein the first conductive pattern layer further includes a compensation bridge wiring separated from the bridge wiring.

5. The display device of claim 4, wherein the compensation bridge wiring comprises:
a first compensation bridge wiring connected to the first sensing electrode array through a first compensation contact hole defined in the sensing insulating layer;
a second-first compensation bridge wiring connected to the second-first sensing electrode through a second-first compensation contact hole defined in the sensing insulating layer; and
a second-second compensation bridge wiring connected to the second-second sensing electrode through a second-second compensation contact hole defined in the sensing insulating layer.

6. The display device of claim 5, wherein the first compensation bridge wiring, the second-first compensation bridge wiring and the second-second compensation bridge wiring are separated from each other.

7. The display device of claim 5, wherein each of the bridge wiring, the first compensation bridge wiring, the second-first compensation bridge wiring and the second-second compensation bridge wiring extends in the second direction.

8. The display device of claim 7, wherein a length of the bridge wiring in the second direction is greater than each of a length of the first compensation bridge wiring in the second direction, a length of the second-first compensation bridge wiring in the second direction and a length of the second-second compensation bridge wiring in the second direction.

9. The display device of claim 8, wherein the length of the first compensation bridge wiring in the second direction, the length of the second-first compensation bridge wiring in the second direction and the length of the second-second compensation bridge wiring in the second direction are equal to each other.

10. The display device of claim 5, wherein:
contact holes are defined in the sensing insulating layer,
the bridge contact holes include a plurality of bridge contact holes, the dummy contact hole includes a plurality of dummy contact holes, the first compensation contact hole includes a plurality of first compensation contact holes, the second-first compensation contact hole includes a plurality of second-first compensation contact holes and the second-second compensation contact hole includes a plurality of second-second compensation contact holes; and
each of the contact holes is any one of the plurality of bridge contact holes, the plurality of dummy contact holes, the plurality of first compensation contact holes, the plurality of second-first compensation contact holes and the plurality of second-second compensation contact holes.

11. The display device of claim 10, wherein:
the display device includes unit areas, each of the unit areas having a same area as each other and same shape as each other when viewed in a plan view; and
each of the unit areas has a same number of contact holes.

12. The display device of claim 10, wherein the contact holes are arranged so that a separation distance in the second direction between two contact holes adjacent to each other in the second direction is constant.

13. The display device of claim 10, wherein the contact holes are arranged so that a separation distance in the first direction between two contact holes adjacent to each other in the first direction is constant.

14. The display device of claim 1, wherein each of the pixels includes a first sub-pixel that emits light of a first color, a second sub-pixel that emits light of a second color and a third sub-pixel that emits light of a third color.

15. The display device of claim 14, wherein in a plan view, an area of a first light emitting area of the first sub-pixel is greater than an area of a second light emitting area of the second sub-pixel, and an area of a third light emitting area of the third sub-pixel is greater than the area of the second light emitting area.

16. The display device of claim 15, wherein:
the second conductive pattern layer is comprised of a mesh pattern; and
the first sensing electrode array, the second-first sensing electrode and the second-second sensing electrode are comprised of parts of the mesh pattern that are separated from each other along cut lines.

17. The display device of claim 16, wherein:
the mesh pattern is comprised of unit opening areas, and
in each of the unit opening areas, the second conductive pattern layer includes a first mesh opening that overlaps two first light emitting areas adjacent in the first direction when viewed in a plan view; two second mesh openings which overlap two second light emitting areas, respectively, when viewed in the plan view; and two third mesh openings which overlap two third light emitting areas, respectively, when viewed in the plan view.

18. The display device of claim 17, wherein when viewed in the plan view, the dummy contact hole is located in an intervening area between two first mesh openings included in two unit opening areas adjacent in the first direction.

19. The display device of claim 1, wherein each of the second-first sensing electrode and the second-second sensing electrode has a rectangular shape when viewed in a plan view.

20. An electronic device comprising:
a processor providing input image data;
a display device displaying an image on a basis of the input image data; and
a power supply supplying power to the display device,
the display device comprising:
a display layer including pixels; and
an input sensing layer disposed on the display layer, the input sensing layer including a first conductive pattern layer, a second conductive pattern layer and a sensing insulating layer interposed between the first conductive pattern layer and the second conductive pattern layer,
wherein the second conductive pattern layer includes a first sensing electrode array extending in a first direction, and second-first and second-second sensing electrodes that are separated from each other in a second direction intersecting the first direction with the first sensing electrode array interposed therebetween,
wherein the first conductive pattern layer includes a bridge wiring connected to the second-first and second-second sensing electrodes through bridge contact holes defined in the sensing insulating layer, the bridge wiring is electrically insulated from and intersects the first sensing electrode array,
wherein the bridge wiring includes a bridge opening exposing an insulating layer disposed under the bridge wiring, and
wherein the first sensing electrode array directly contacts the insulating layer exposed by the bridge opening, through a dummy contact hole defined in the sensing insulating layer.

\* \* \* \* \*